United States Patent
Orozco Valdes et al.

(10) Patent No.: US 10,725,080 B2
(45) Date of Patent: Jul. 28, 2020

(54) CORRELATION OF DEVICE-UNDER-TEST ORIENTATIONS AND RADIO FREQUENCY MEASUREMENTS

(71) Applicant: NATIONAL INSTRUMENTS CORPORATION, Austin, TX (US)

(72) Inventors: Gerardo Orozco Valdes, Austin, TX (US); Thomas Deckert, Dresden (DE); Johannes D. H. Lange, Dresden (DE); Christopher N. White, Cedar Park, TX (US); Karl F. Grosz, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 107 days.

(21) Appl. No.: 16/141,733

(22) Filed: Sep. 25, 2018

(65) Prior Publication Data
US 2020/0096547 A1 Mar. 26, 2020

(51) Int. Cl.
*G01R 29/08* (2006.01)
*H04B 17/29* (2015.01)
*H04B 17/10* (2015.01)

(52) U.S. Cl.
CPC ....... *G01R 29/0892* (2013.01); *H04B 17/101* (2015.01); *H04B 17/29* (2015.01); *G01R 29/0864* (2013.01)

(58) Field of Classification Search
CPC .... G01R 29/00; G01R 29/08; G01R 29/0864; G01R 29/0892; H04B 17/00; H04B 17/10; H04B 17/101; H04B 17/20; H04B 17/29
(Continued)

(56) References Cited

U.S. PATENT DOCUMENTS 4,968,983 A 11/1990 Maeda
5,001,494 A 3/1991 Dorman et al.
(Continued)

FOREIGN PATENT DOCUMENTS

CN 107748298 A 3/2018
EP 2853907 A1 4/2015
(Continued)

OTHER PUBLICATIONS

International Search Report and Written Opinion in International Application No. PCT/US2019/032233, dated Aug. 20, 2019, 15 pages.
(Continued)

*Primary Examiner* — Hoai-An D. Nugyen
(74) *Attorney, Agent, or Firm* — Kowert Hood Munyon Rankin and Goetzel PC; Jeffrey C. Hood; Luke S. Langsjoen

(57) ABSTRACT

Antenna characterization systems and methods are described for hardware-timed testing of integrated circuits (IC) with integrated antennas configured for over-the-air transmission and/or reception. An IC to be tested (e.g., the device under test (DUT)) may be mounted to an adjustable positioner in an anechoic chamber. Radio frequency (RF) characteristics (e.g., including transmission characteristics, reception characteristics, and/or beamforming characteristics) of the IC may be tested over-the-air using an array of antennas or probes within the anechoic chamber while continually transitioning the adjustable positioner through a plurality of orientations. Counters and reference trigger intelligence may be employed to correlate measurement results with orientations of the DUT.

20 Claims, 24 Drawing Sheets

(58) Field of Classification Search
USPC ...... 324/600, 612, 500, 537, 750.16, 762.01
See application file for complete search history.

(56) References Cited

U.S. PATENT DOCUMENTS

| | | | |
|---|---|---|---|
| 5,119,105 A | | 6/1992 | Ngai et al. |
| 8,471,774 B2* | | 6/2013 | Oh .................. G01R 29/10 342/360 |
| 2006/0194553 A1* | | 8/2006 | Ozaki .................. G01R 29/10 455/226.1 |
| 2009/0084426 A1 | | 4/2009 | Snow et al. |
| 2009/0153158 A1 | | 6/2009 | Dunn et al. |
| 2009/0231217 A1 | | 9/2009 | Grange et al. |
| 2010/0149038 A1 | | 6/2010 | Brown et al. |
| 2011/0065449 A1 | | 3/2011 | Zimmerman |
| 2012/0212244 A1 | | 8/2012 | Zhao et al. |
| 2012/0293379 A1 | | 11/2012 | Nickel et al. |
| 2013/0257454 A1* | | 10/2013 | Mow .................. H01Q 9/0421 324/619 |
| 2014/0039826 A1 | | 2/2014 | Valdes |
| 2014/0161164 A1 | | 6/2014 | Emmanuel et al. |
| 2014/0306843 A1 | | 10/2014 | Merkel et al. |
| 2014/0370821 A1 | | 12/2014 | Guterman et al. |
| 2015/0177277 A1 | | 6/2015 | Nickel et al. |
| 2016/0018438 A1 | | 1/2016 | Chou et al. |
| 2016/0146922 A1* | | 5/2016 | Moshfeghi .......... H04W 64/006 455/456.6 |
| 2016/0259030 A1 | | 9/2016 | Jiao et al. |
| 2016/0370426 A1 | | 12/2016 | Jimenez et al. |
| 2019/0043288 A1* | | 2/2019 | Tachibana ............ H04W 4/027 |
| 2019/0079175 A1* | | 3/2019 | Yamanouchi ............ G01S 7/02 |
| 2019/0113556 A1 | | 4/2019 | Kao |

FOREIGN PATENT DOCUMENTS

| | | |
|---|---|---|
| EP | 3264641 A1 | 1/2018 |
| JP | 09311153 | 2/1997 |

OTHER PUBLICATIONS

European Telecommunications Standards Institute (ETSI)—TR 102 273-2 v1.2.1 (Technical Report) "Part 1: Electromagnet Compatibility and Radio Spectrum Matters (ERM); Improvement on Radiated Methods of Measurement (using test site) and Evaluation of the Corresponding Measurement Uncertainties; Part 2: Anechoic Chamber" Dec. 2001; pp. 1-107; Sophia Antipolis Cedex—France. (107 pages).
3rd Generation Partnership Project (3GPP)—TR 38.810 v2.3.0 (Technical Report) "3rd Generation Partnership Project; Technical Specification Group Radio Access Network; Study on Test Methods for New Radio (Release 15)" Aug. 2018; pp. 1-94; Sophia Antipolis Valbonne—France. (94 pages).
CTIA—"Test Plan for Wireless Device Over-the-Air Performance" Version 3.7.1; Feb. 2018; pp. 1-591; Washington, DC (USA). (591 pages).
Rochester Institute of Technology (RIT) "Anechoic Chamber Quiet Zone Calculation (Rectangular Chamber)"—Kate Gleason College of Engineering—Dec. 2001. (4 pages).
Rohde & Schwarz Website: "ATS1000 Antenna Test System"—retrieved 2018 from < https://www.rohde-schwarz.com/us/product/ats1000-productstartpage_63493-394432.html > (2 pages).
"OTA Test for Millimeter-Wave 5G NR Devices and Systems"—Keysight Technologies; Oct. 5, 2017. (20 pages).
"Proposals on Concluding the SI" R4-1801811—3GPP TSG-RAN WG4 Meeting #86—Feb. 26-Mar. 2, 2018; Athens, Greece. (10 pages).
"Way Forward on Measurement Grids for Non-Sparse Antenna Arrays"—3GPP TSG-RAN WG4 Meeting #86bis—Apr. 16-20, 2018; Melbourne, Australia. (9 pages).
International Search Report and Written Opinion in International Application No. PCT/US2019/052347 dated Dec. 4, 2019, 15 pages.

* cited by examiner

256-Element Array Chip

CORRELATION OF DEVICE-UNDER-TEST ORIENTATIONS AND RADIO FREQUENCY MEASUREMENTS

FIELD OF THE INVENTION

The present invention relates to the field of semiconductor and/or mobile device testing, and more specifically, to hardware-timed over-the-air antenna characterization.

DESCRIPTION OF THE RELATED ART

Antenna transmission and reception technology is rapidly growing in importance, e.g., as $5^{th}$ generation (5G) wireless technology is becoming more widespread. Current methods for testing integrated circuits with integrated antennas for transmitting and/or receiving over-the-air signals may be slow and/or expensive, e.g., in part because the integrated circuit being tested may need to be positioned according to many different orientations and the integrated antennas may need to be tested according to a plurality of transmit powers and/or frequencies. Improvements in the field are therefore desired.

SUMMARY OF THE INVENTION

Various embodiments are presented below of antenna characterization systems and methods for hardware-timed testing of integrated circuits (IC) with integrated antennas configured for over-the-air transmission and/or reception. An IC to be tested (e.g., the device under test (DUT)) may be mounted to an adjustable positioner in an anechoic chamber. Power and data connections of the IC may be tested over the fixed conductive interface. Radio frequency (RF) characteristics (e.g., including transmission characteristics, reception characteristics, beamforming characteristics, etc.) of the IC may be tested over-the-air using an array of antennas or probes within the anechoic chamber while continually transitioning the adjustable positioner through a plurality of orientations. Counters and reference trigger intelligence may be employed to correlate measurement results with orientations of the DUT.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which.

Figure 1:
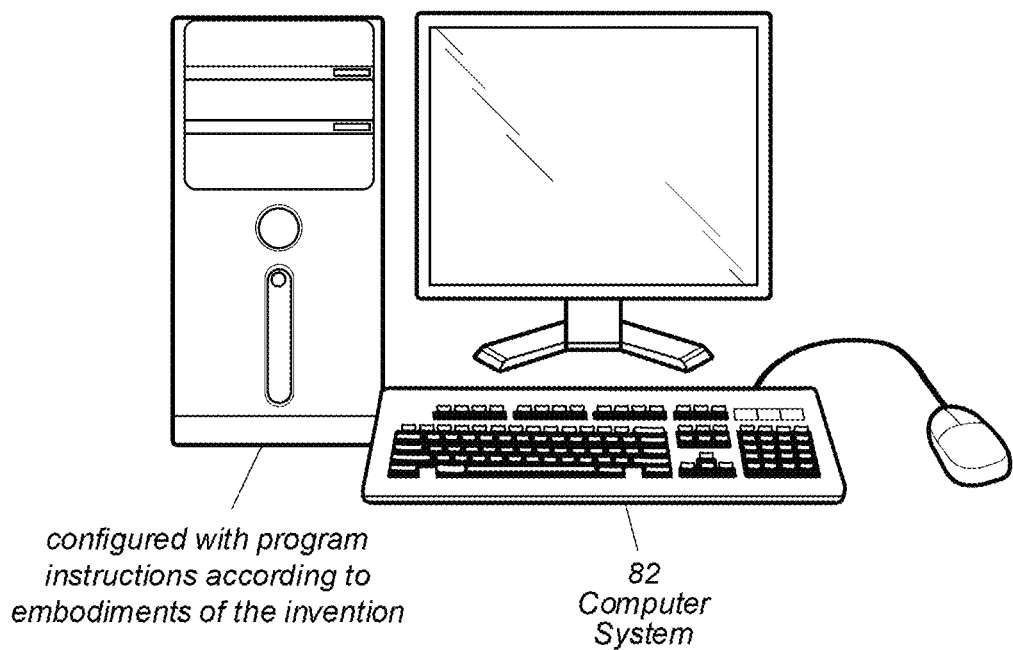
FIG. 1 illustrates a computer system configured to perform testing of an integrated circuit, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPGAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually," wherein the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism," where the tasks are performed in an interleaved manner, e.g., by time multiplexing of execution threads.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

FIG. 1—Computer System

FIG. 1 illustrates a computer system 82 configured to implement embodiments of the techniques disclosed herein. Embodiments of a method for (e.g., for production testing of integrated circuits) are described below. Note that various embodiments of the techniques disclosed herein may be implemented in a variety of different ways. For example, in some embodiments, some or all of the techniques may be implemented with textual or graphical programs that may be deployed to, or used to configure, any of various hardware devices.

However, while some embodiments are described in terms of one or more programs, e.g., graphical programs, executing on a computer, e.g., computer system 82, these embodiments are exemplary only, and are not intended to limit the techniques to any particular implementation or platform. Thus, for example, in some embodiments, the techniques may be implemented on or by a functional unit (also referred to herein as a processing element), which may include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

As shown in FIG. 1, the computer system 82 may include a display device configured to display a graphical program as the graphical program is created and/or executed. The display device may also be configured to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more programs, such as graphical programs, that are executable to perform the methods described herein. The memory medium may also store operating system software, as well as other software for operation of the computer system. Various embodiments further include receiving or storing instructions and/or data implemented in accordance with the foregoing description upon a carrier medium.

Exemplary Systems

Embodiments of the present invention may be involved with performing test and/or measurement functions; controlling and/or modeling instrumentation or industrial automation hardware; modeling and simulation functions, e.g., modeling or simulating a device or product being developed or tested, etc. Exemplary test applications include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2:
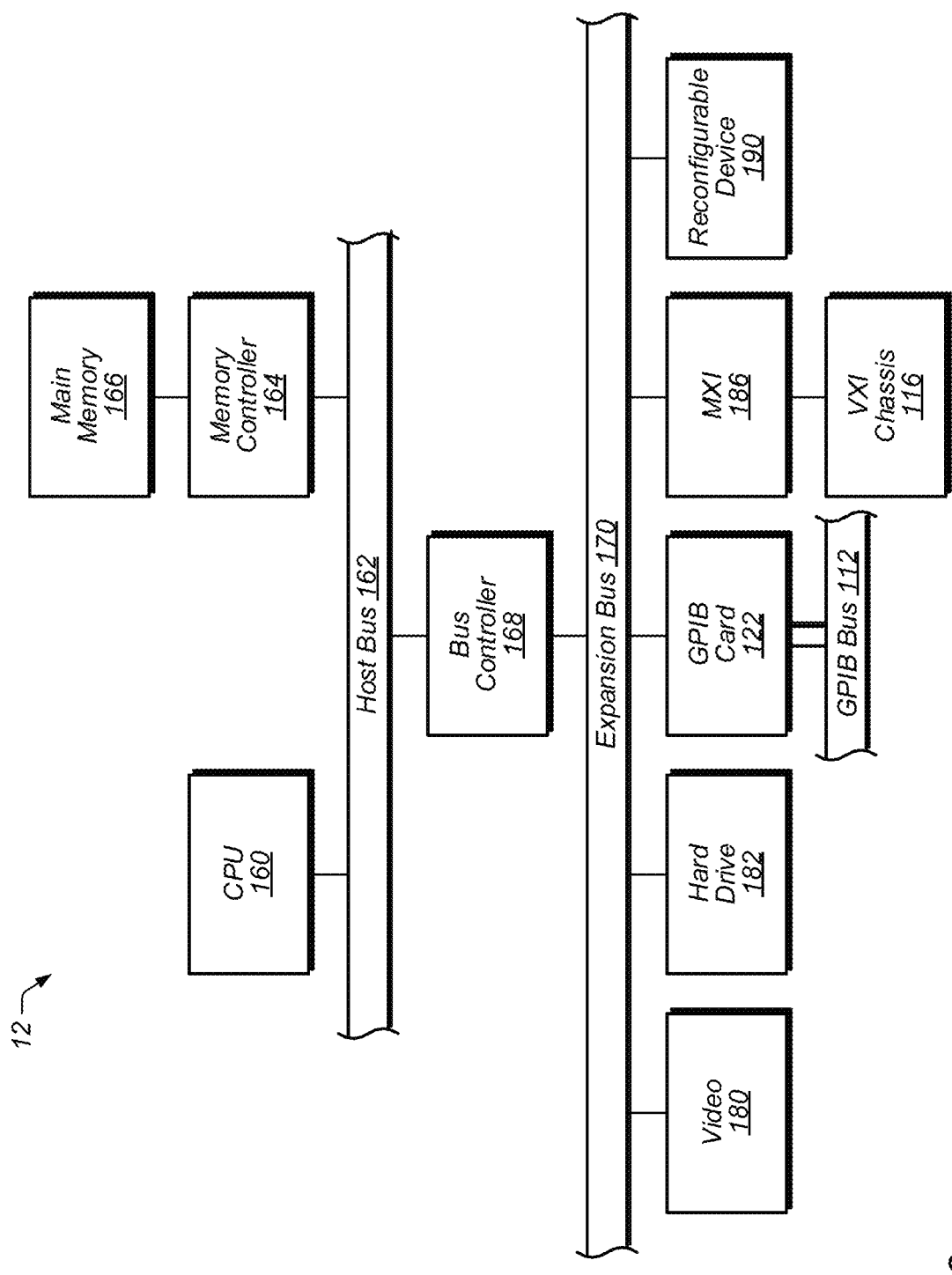
FIG. 2 is an exemplary block diagram of the computer system of FIG. 1, according to some embodiments.

FIG. 2—Computer System Block Diagram

FIG. 2 is a block diagram 12 representing one embodiment of the computer system 82 illustrated in FIG. 1. It is noted that any type of computer system configuration or architecture can be used as desired, and FIG. 2 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including any type of processor (or multiple processors), as well as other features. A memory medium, typically comprising RAM and referred to as main memory, 166 is coupled to the host bus 162 by means of memory controller 164. The main memory 166 may store a program (e.g., a graphical program) configured to implement embodiments of the present techniques. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170. The computer 82 may also comprise a GPIB card 122 coupled to a GPIB bus 112, and/or an MXI device 186 coupled to a VXI chassis 116.

As shown, a device 190 may also be connected to the computer. The device 190 may include a processor and memory which may execute a real time operating system. The device 190 may also or instead comprise a programmable hardware element. The computer system may be configured to deploy a program to the device 190 for execution of the program on the device 190. The deployed program may take the form of graphical program instructions or data structures that directly represents the graphical program. Alternatively, the deployed program may take the form of text code (e.g., C code) generated from the program. As another example, the deployed program may take the form of compiled code generated from either the program or from text code that in turn was generated from the program.

FIGS. 3-8—Integrated Circuit (IC) with Antennas

Integrated circuits (IC) with integrated antennas are increasingly common. Such ICs are included in many devices and may be configured to perform various functions including wireless communication (e.g., including transmission and/or reception) and radar. In particular, 5G wireless communication standards (or other standards) may provide for the use of millimeter wave (mmW) band wireless signals and beamforming (e.g., directional transmission/reception). It is anticipated that upcoming cellular communication technologies such as 5G or other technologies may use multiple antennas in a coordinated fashion to focus the transmitted energy toward one spatial point. The pattern formed by the antenna elements is called a beam and the process of focusing energy is called beamforming. ICs or application specific ICs (ASICs) may be an important element of many wireless devices configured to communicate using such standards. For example, an IC with an integrated array of antennas (e.g., a phased array) may be a common means of including such 5G wireless capabilities.

Figure 3:
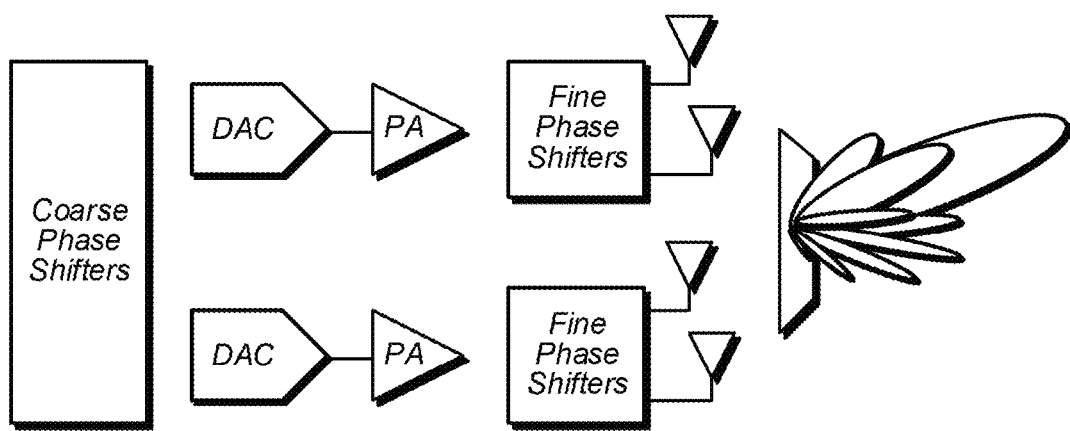
FIG. 3 illustrates multi-antenna beamforming using coarse and fine phase shifters, according to some embodiments.

FIG. 3 illustrates an example phase array architecture usable for beamforming. FIG. 3 illustrates a phase array antenna analog and digital hybrid architecture, useable to focus the energy of the Tx signal in a specific spatial location. As illustrated, course phase shifters process a digital signal which is sent through digital-to-analog converters (DACs) and power amplifiers (PAs) before being processed by fine phase shifters and transmitted by four antennas to form a directional beam.

Figure 4:
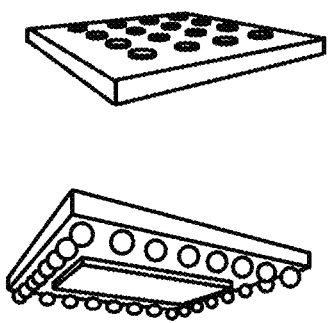
FIGS. 4-9 illustrate exemplary integrated circuit devices-under-test (DUTs), according to some embodiments.

FIG. 4 illustrates a phased array of antennas which may be incorporated into an IC such as a complementary metal-oxide-semiconductor (CMOS) Monolithic Microwave Integrated Circuit (MMIC). The IC may be approximately 1 cm by 1 cm, among various possibilities.

Figure 5:
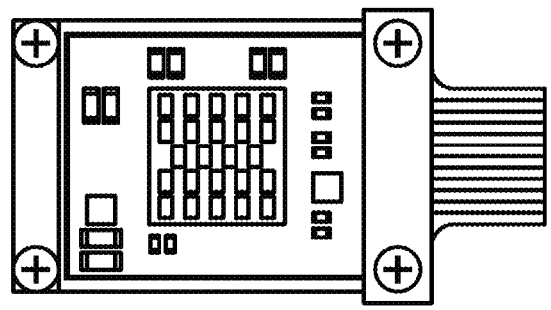

FIG. 5 illustrates an exemplary IC, including an integrated antenna array.

Figure 6:
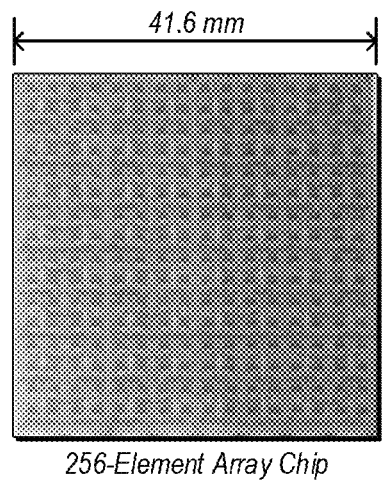

FIG. 6 illustrates an exemplary array of 256 antennas on a chip. It should be noted that other numbers or configurations of antennas are possible, as well as other sizes of chips, modules, and/or entire mobile devices or user equipment devices (UEs).

Figure 7:
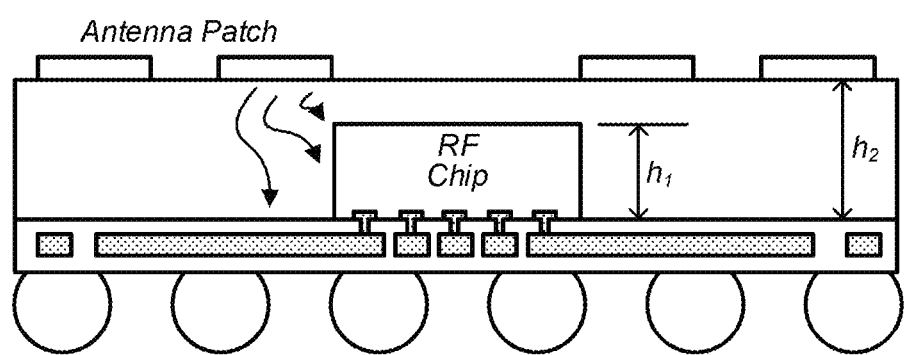

FIG. 7 illustrates an exemplary IC. As shown, the IC includes multiple (e.g., any desired number) antenna patches mounted to a chip (e.g., a printed circuit board (PCB), glass wafer, silicon wafer, etc.). The antenna patches may transmit signals to and from an integrated RF chip (or chips). Note that the RF chip may be included in the chip, but may not reach the full thickness of the chip. In the illustrated example, the RF chip reaches height h1, which is less than the full height of the chip, h2. The RF chip may be connected to other elements of the IC, e.g., via wired connections.

Figure 8:
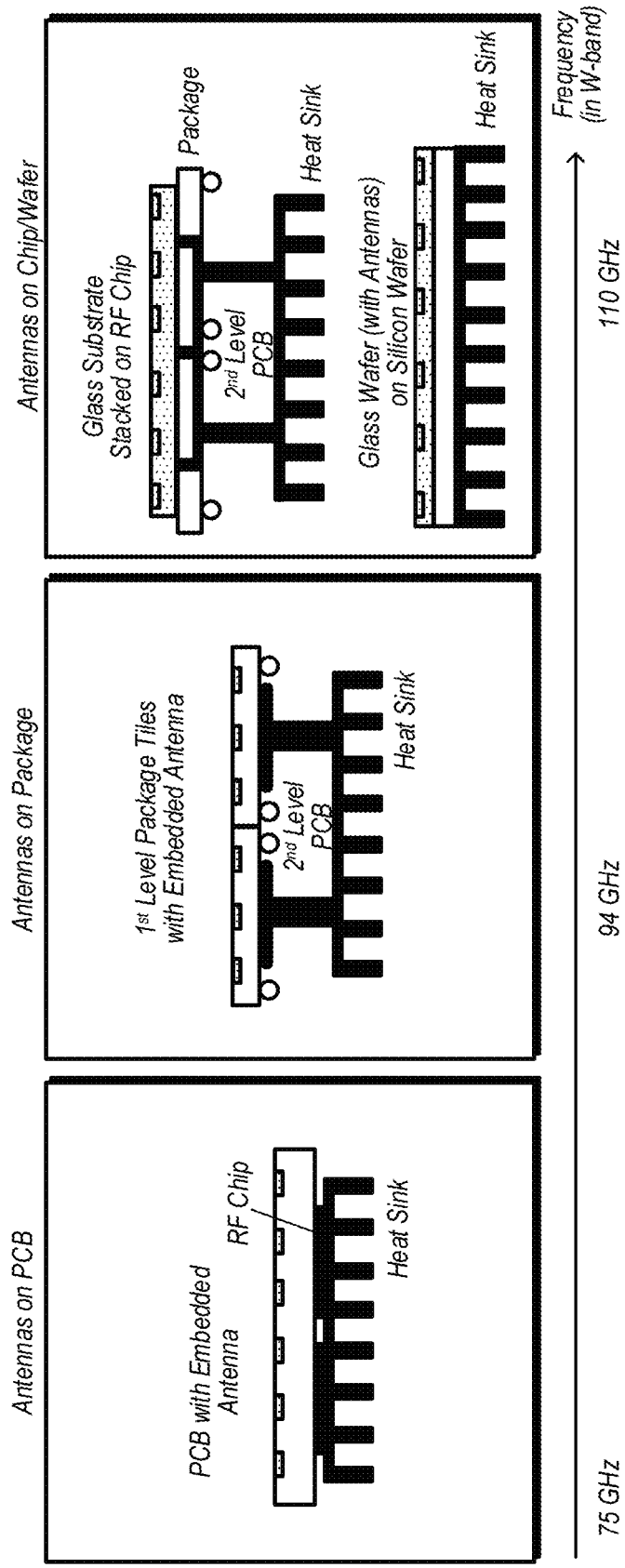

FIG. 8 illustrates different types of antenna connections of exemplary ICs. In a first configuration, antennas may be embedded in a printed circuit board (PCB), to which RF chips and a heat sink are mounted. Such a configuration may be useful for relatively low frequencies, e.g., approximately 75 GHz, according to some embodiments. In a second configuration, antenna patches may be embedded in package tiles, which are in turn mounted to RF chips and a (e.g., $2^{nd}$ level) PCB. The RF chips may be connected (thru the PCB) to a heat sink. Such a configuration may be useful for medium frequencies, e.g. 94 GHz, among various possibilities. A third configuration may include antenna patches embedded in a glass substrate and stacked on RF chips, e.g., above a package, $2^{nd}$ level PCB, and heat sink. In a variation, the glass wafer may be mounted on a silicon wafer instead of a package. Such configurations may be useful for higher frequencies, e.g., 110 GHz and above, among various possibilities.

Figure 9:
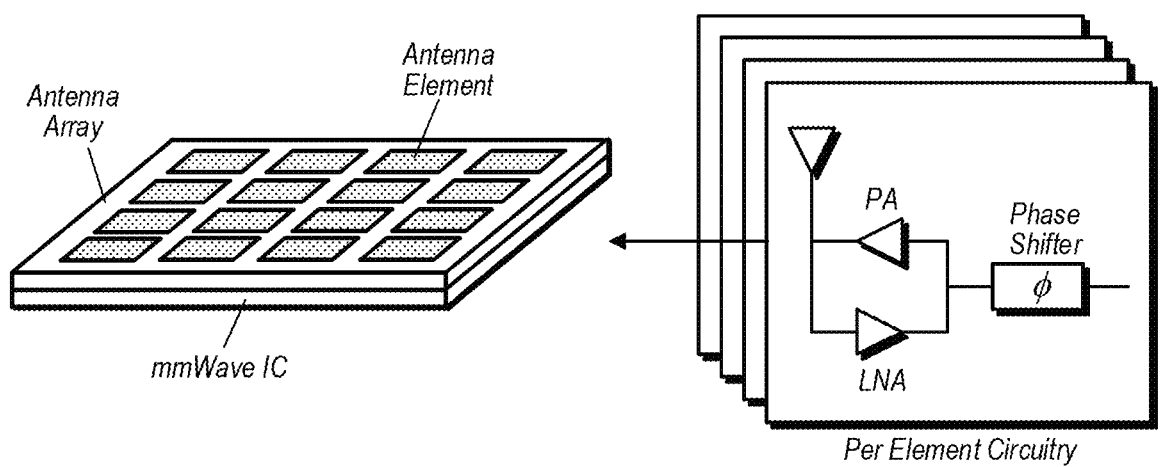

FIG. 9 illustrates an exemplary mmW IC with an integrated antenna array. As shown, each antenna element (e.g., patch) may have dedicated (e.g., per element) circuitry. Note that the specific antenna element circuitry shown is exemplary only, and that other antenna element circuitry configurations may be used, as desired.

Figure 10:
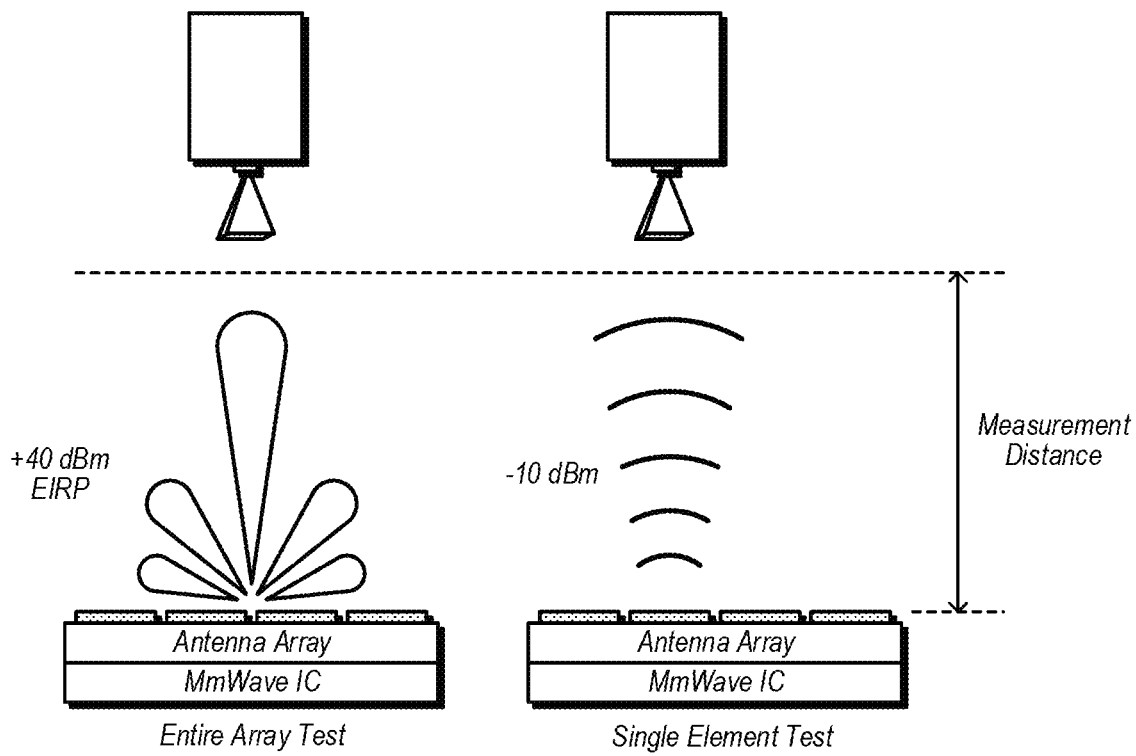
FIG. 10 illustrates measurement setup for an entire array test and a single element test, according to some embodiments.

FIG. 10—Testing of mmW IC RF Performance

As demand for ICs with integrated antenna arrays grows, improvements in the cost of producing and testing such ICs are desired. Testing of mmW ICs, e.g., according to conventional techniques, may be challenging for various reasons. The radio frequency (RF) performance (e.g., mmW transmission and reception) of an antenna under test (AUT) or device under test (DUT) may typically be tested over-the-air. Anechoic chambers are commonly used for these tests to avoid interference, e.g., due to reflected signals and multipath effects that can complicate test measurements. Beamforming requirements may lead to many antennas on a package or on a chip and it may be desired to test the beamforming directional capabilities of the antenna array/IC. Testing of the beamforming capabilities may be expensive, time-consuming, and/or difficult, as measurements may need to be taken from a potentially large number of positions, e.g., because the RF performance may vary spatially. In other words, in order to test the spatial RF performance, measurements must be taken in many positions (e.g., in 3 dimensions, e.g., as a function of x, y, and z position). Such detailed spatial testing may require complex calibration.

FIG. 10 illustrates certain aspects of over-the-air testing of RF performance, according to some embodiments. An entire array may be tested, e.g., using an antenna, e.g., a horn antenna as illustrated or other type of antenna (e.g., patch, dipole, loop, directional array, etc.). In order to test the beamforming capability of the array, the antenna (or antennas) may be positioned at a sufficiently large measurement distance that the beam is fully formed. Further, measurements may be taken from a variety of different positions in order to test the performance of the beam in different directions. An entire array test may involve relatively high power signals, e.g., +40 dBm, as shown, among various possibilities. Alternatively, single element tests may be performed. A single element test may require that the horn antenna be far enough away from the antenna element to be tested to avoid RF coupling. This distance may be smaller than the distance for beam formation, e.g., for an entire array test. A single element test may not test the beamforming performance of the array. Single element tests may involve relatively low power signals, e.g., −10 dBm, as shown, among various possibilities.

Figure 11:
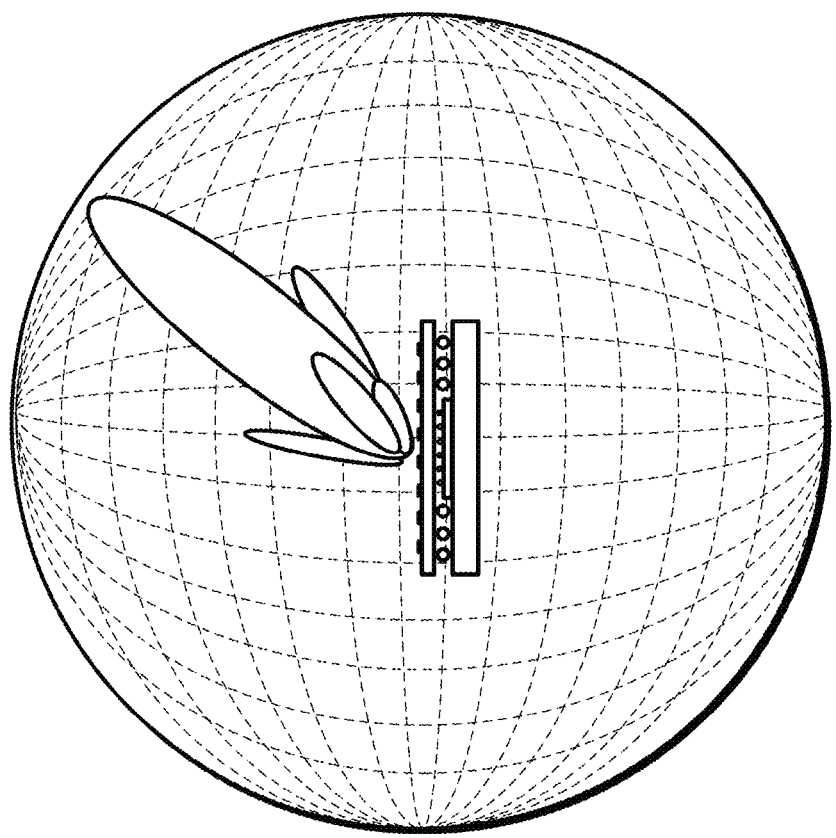
FIG. 11 is an illustration of a 3D beamforming pattern, according to some embodiments.

Because the electromagnetic pattern of a beamforming antenna array is characterized over the air (OTA), there are standardized ways to measure the actual signal strength of antennas in a controlled OTA environment. The antenna under test (AUT) or device under test (DUT) may be placed inside a chamber (possibly an anechoic chamber, to minimize reflections and interference from outside sources, though other types of chambers may be used, as desired). A signal may be transmitted by the antenna and one or more receive antennas (also located inside the chamber) may capture the received power. The AUT may then be moved across a discretized spatial profile. As these points are measured, a 3D pattern is created, as illustrated in FIG. 11. According to various embodiments, the measurement method may vary in the type of chamber used, the geometry and sequence of the measurement grid (e.g., equal angles, spiraling down a sphere, single cross plane points, etc.), and the calibration method used for the measurement process.

Additionally, while some embodiments describe a DUT or AUT that transmits a beamforming signal that is measured by one or more receivers within the chamber, an inverse setup is also possible where over-the-air (OTA) reception properties of the DUT are tested and/or characterized. For example, one or more transmitters may be positioned within the chamber, and the DUT may receive transmissions of the one or more transmitters, wherein reception characteristics of the DUT receiver may be characterized from a plurality of directions. As may be appreciated by one of skill in the art, methods and systems described herein may be adapted to embodiments where properties of one or more OTA receivers of the DUT are characterized. Accordingly, descriptive instances of an AUT and one or more receive antennas of the anechoic chamber may be respectively replaced with a receiver of a DUT and one or more transmit antennas of the anechoic chamber, according to some embodiments.

Figure 12:
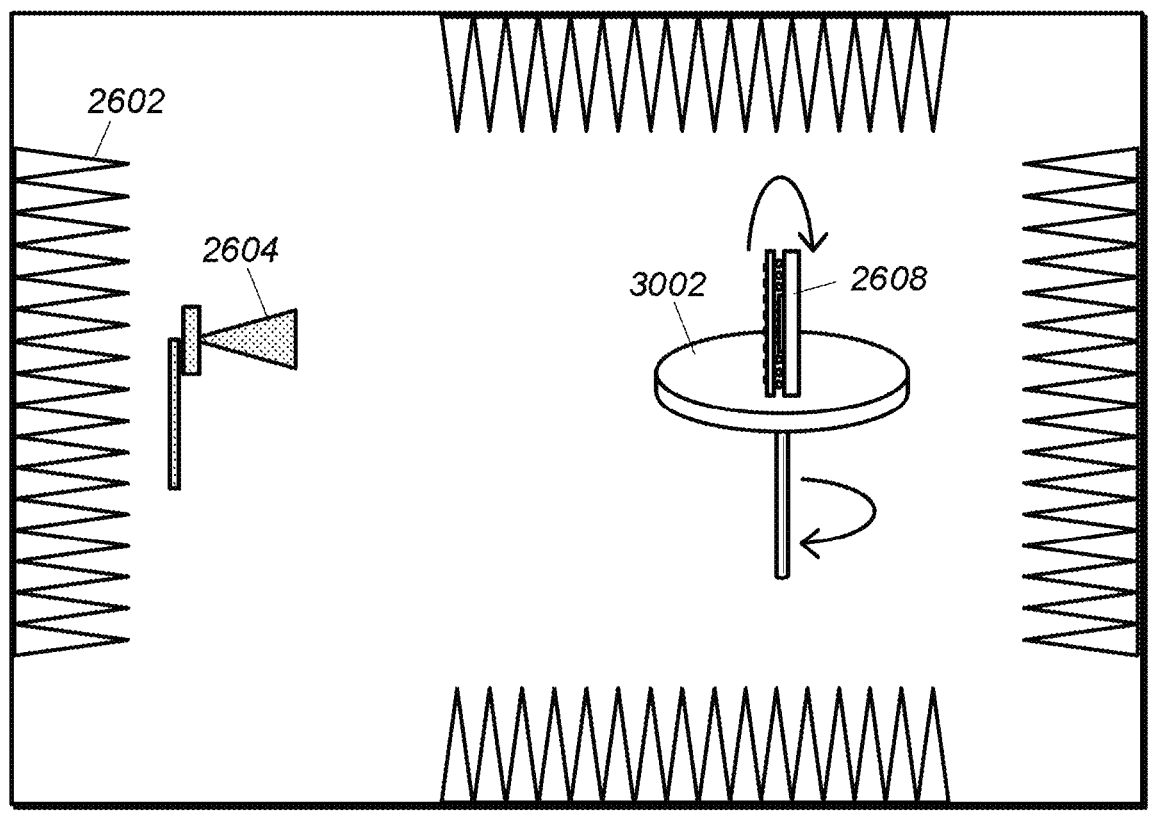
FIG. 12 is a schematic diagram illustrating a typical setup for over-the-air (OTA) antenna testing, according to some embodiments.

FIG. 12—Anechoic Chamber Antenna Measurement Setup

Figure 13:
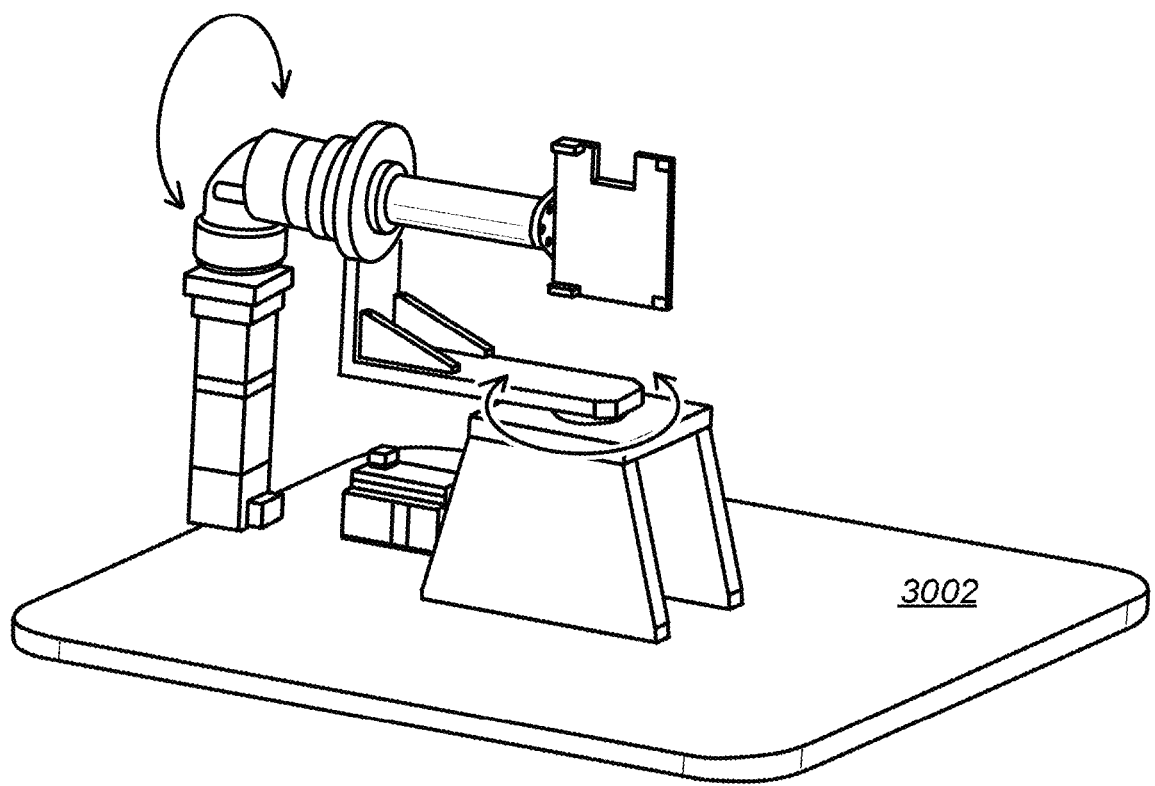
FIG. 13 is a detailed illustration of an exemplary adjustable positioner, according to some embodiments.

FIG. 12 is a schematic diagram illustrating a typical setup for OTA antenna testing, according to some embodiments. As illustrated, the adjustable positioner 3002 may rotate along two orthogonal axes (or only one axis, in some embodiments) to capture the output pattern of the AUT 2608 according to a plurality of spatial orientations. Dampeners 2602 of the anechoic chamber may prevent reflections and interference of the output pattern, and the receive antenna 2604 may measure the output of the AUT. In previous implementations, the movement may be controlled via test sequencing software that ensures that the turntable is in the right angle, after which the RF measurement may take a power measurement. A more detailed illustration of an exemplary adjustable positioner 3002 is shown in FIG. 13, where the arrows indicate the two orthogonal axes of rotation of the positioner. As may be appreciated by those of skill in the art, any of a variety of types of adjustable positioners may be used to hold and orient the AUT or DUT according to a plurality of orientations, and the examples illustrated for the adjustable positioner in FIGS. 12 and 13 are exemplary only, and are not intended to limit the scope of the disclosure.

Figure 14:
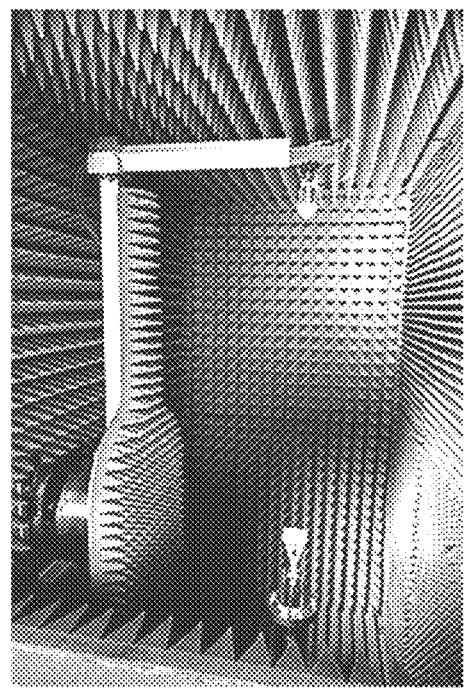
FIG. 14 is a schematic diagram illustrating an OTA antenna testing setup using a combination of a positioning arm and rotary positioner, according to some embodiments.

FIG. 14 in an isometric illustration of an OTA testing setup wherein an adjustable positioning arm is combined with DUT rotation. For example, each of the reception antenna(s) and the DUT may be separately rotatable to a plurality of orientations.

Figure 15:
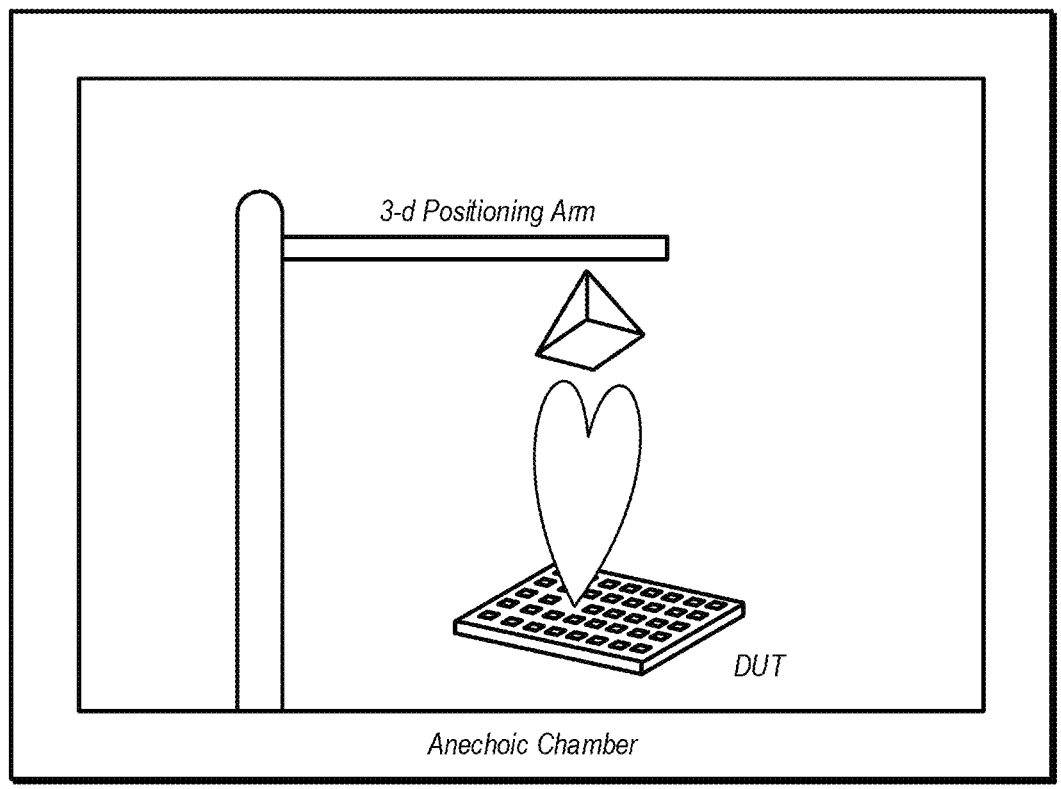
FIG. 15 is an isometric illustration of an OTA antenna testing setup using a 3D positioning arm, according to some embodiments.

In other embodiments, as illustrated in FIG. 15, a mmW array of antennas may be tested using a 3-D positioning arm, wherein the AUT is stationary but the receive antenna(s) rotate through a sequence of positions. FIG. 15 is a schematic illustration of an anechoic chamber configured with a 3-D positioning arm. Such 3-D positioning arm may operate in an anechoic chamber, e.g., sized for 18-87 GHz frequencies, among various possibilities. The 3-D positioning arm may perform spiral scanning, e.g., to take measurements at any number of locations, e.g., using a horn antenna. As illustrated in FIG. 15, the AUT may be mounted in the chamber, and may be configured to transmit a signal in a beamforming pattern (e.g., in a tested beam form). The 3-D positioning arm may move a horn antenna in various positions in the chamber for measurements.

A low reflection antenna (e.g., a small radar cross section) may be used for testing, e.g., in order to minimize effects on the fields. The measurements may be taken in the near field (e.g., in the Fresnel zone of the near field). Tests may be performed to measure magnitude and phase of the signal/field at any number of locations. The far field pattern may be computed based on the near field measurements. The conversion of near-field to far-field may be accomplished using any appropriate calculation approach. Such calculations may be relatively straight forward if the antenna pattern/configuration is known, or more complex for an arbitrary pattern. Plots of the far field pattern may be generated. Such a 3-D positioning system may be useful for design and characterization tests, however the equipment may be relatively expensive and the tests may be time consuming. First, the testing process itself may take significant time, e.g., because of the need to move the 3-D positioning arm through a large number of positions to test each DUT. Second, the anechoic chamber may need to be large enough to allow for measurements to be taken in enough positions (e.g., in 3-D space) to compute the far field pattern. In some embodiments, the anechoic chamber may be large enough so that measurements may be taken in the radiating far field. In some embodiments, a compact antenna test range (CATR) may employ a reflector to reduce the far field distance, enabling far field measurements within a smaller anechoic chamber.

Figure 16:
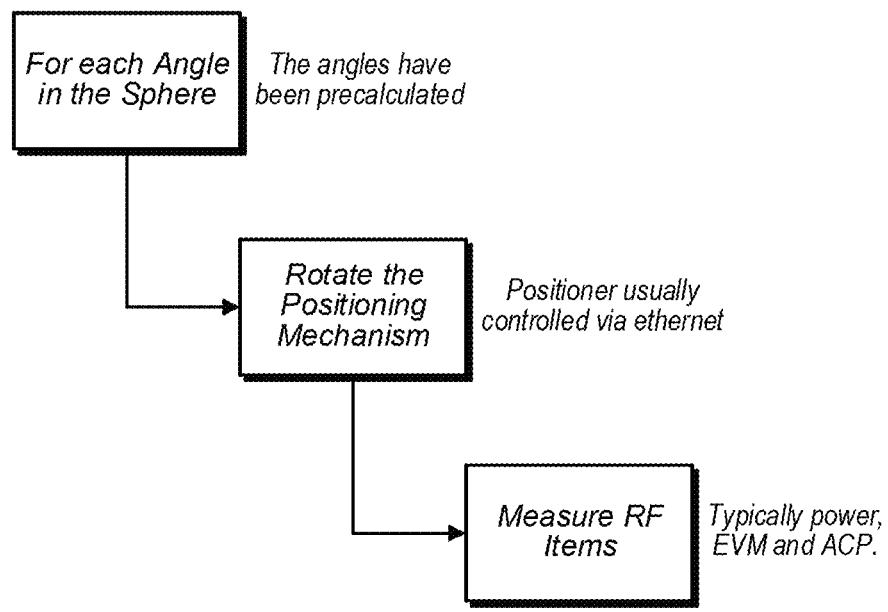
FIG. 16 is a flowchart diagram illustrating a method for a software driven procedure to characterize over-the-air (OTA) transmission properties of an AUT, according to some embodiments.

FIG. 16—Legacy Method for Software-Driven AUT Characterization

FIG. 16 is a flowchart diagram illustrating a legacy method for a software driven procedure to characterize over-the-air (OTA) transmission properties of an AUT. As illustrated, a positioning mechanism is rotated according to a precalculated angle in the sphere (typically controlled via ethernet), after which the RF characteristics are measured (typically power, error vector magnitude (EVM), or adjacent channel power (ACP), among other possibilities). The process may repeat until all predetermined angles are reached and measured. The loop process may have other sweep items like "input RF power" or "frequency", and these items may further increase the duration of the process. AUT characterization often performs measurements of total radiated power. Performing a total radiated power measurement typically involves physically rotating the AUT to a large number of orientations, as the accuracy of this measurement increases with the number of sample points taken around the sphere.

These legacy procedures are typically non-deterministic and executed through software-timed procedures. In addition, the methods rely on start/stop motion in order to allow sufficient settling and pause time at a given position for the measurement system to perform an acquisition with sufficient time accuracy. These methods are very slow, and characterization test times are critical for designers. The software interaction is a large component of the latency, and embodiment herein improve on these legacy methods by implementing a hardware-timed closed loop system. The total test time for legacy software-timed method may be estimated as:

$$T_{TOTAL} = \Sigma_{i=0}^{M}(t_{positioner(i)} + t_{RF(i)})$$

Where $t_{positioner}$ is the individual time to translate to and settle at each measurement position and $t_{RF}$ is the time to compute and fetch a single RF measurement. In some embodiments described herein $t_{positioner}$ may be reduced, thereby reducing the latency of the measurement acquisition process, by continually transitioning the DUT through a plurality of orientations without halting the motion of the DUT between orientations. For example, a continuous transition process may remove the settle time of the DUT.

Additionally, in a software-timed measurement acquisition method, significant latency may be introduced through $t_{RF}$ due to software interrupts, operating system latency, computational latency, and other factors. Embodiments herein describe systems and methods for performing hardware-timed OTA antenna characterization, where direct hardware signaling between structural elements of the antenna characterization system may automatically trigger method steps of the measurement acquisition process without introducing software or processing latency. For example, hardware-triggered digital feedback from the adjustable positioner may be used to keep track of the correlation between the orientation of the DUT and the corresponding measurement acquisitions, without pausing the acquisition process with intermittent software directives. Accordingly, the time and computational resources used for the measurement acquisition process may be dramatically reduced.

Encoding Orientation of the Adjustable Positioner

Figure 17:
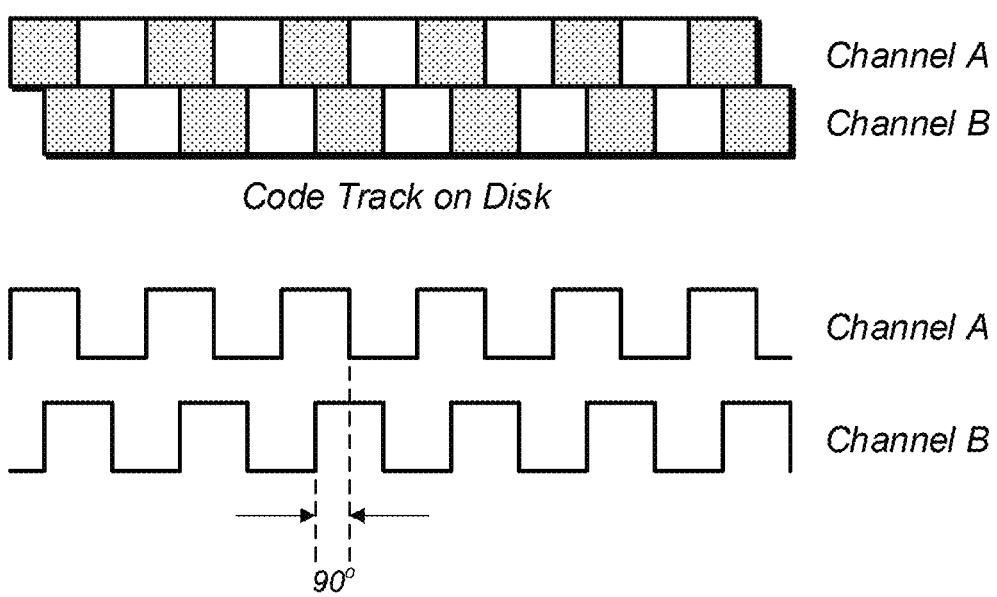
FIG. 17 illustrates dual channel code tracks of a quadrature encoder, according to some embodiments.

A variety of encoding schemes may be used to track the orientation of the adjustable positioner. A quadrature encoder is a common type of incremental encoder that uses two output channels (A and B) to sense position. Using two code tracks with sectors positioned 90 degrees out of phase, the two output channels of the quadrature encoder indicate both position and direction of rotation. As illustrated in FIG. 17, if A leads B, for example, the disk is rotating in a clockwise direction. If B leads A, then the disk is rotating in a counter-clockwise direction. By monitoring both the number of pulses and the relative phase of signals A and B, both the position and direction of rotation may be tracked.

In some embodiments, a quadrature encoder may also include a third output channel, called a zero or index or reference signal, which supplies a single pulse per revolution. This single pulse may be used for precise determination of a reference position.

In some embodiments, the positioner may be configured to export digital lines whose length are proportional to the speed of the positioner to signal when and how fast the positioner is moving.

Hardware Timed OTA Antenna Characterization

According to exemplary embodiments, the OTA antenna characterization process may be sped up substantially with a hardware-timed measurement system that incorporates a deterministic closed control loop between the measurement system and the motion of the AUT. Most rotation mechanisms (e.g., the adjustable positioner) use servo motors or some sort of encoders to determine the exact position. These devices may use position tracking as a way to determine their location in the circle of motion. These signals are commonly internal to the rotation mechanism. Embodiments described herein redesign a rotation mechanism to export the encoder signals to be used in synchronization of the OTA antenna characterization process.

Figure 18:
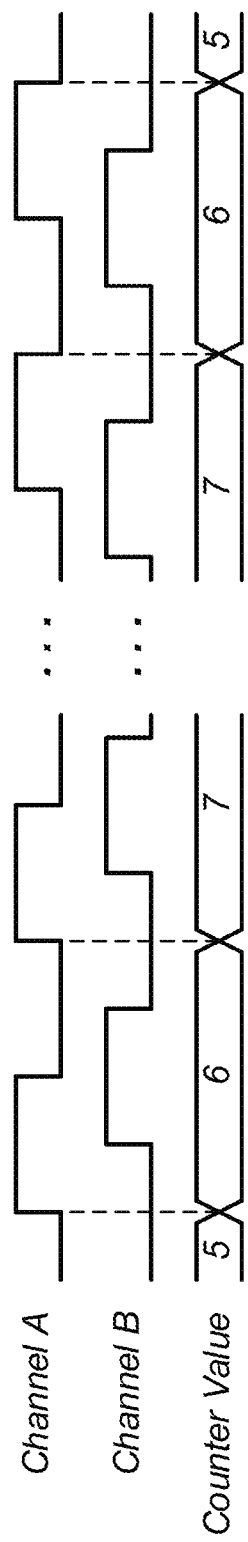
FIG. 18 illustrates how the dual channels of a quadrature encoder lead to incrementing and decrementing a counter value, according to some embodiments.

The rotation mechanism of the adjustable positioner may consist of two degrees of freedom (e.g., to orthogonal axes of rotation), where each degree of freedom has a feedback mechanism. Alternatively, the rotation mechanism may only utilize a single axis of rotation. As illustrated in FIG. 18, a quadrature encoder that provides digital signals may be used by a digital counter to keep track of the position (count) of the motors. As illustrated, the counter value may be incremented at the beginning of each pulse on Channel A when Channel A is leading Channel B by 90 degrees. Conversely, when Channel B is leading Channel A, the counter value may be decremented at the end of each Channel A pulse (e.g., because the rotation mechanism is moving in the opposite direction when Channel B leads Channel A).

The counter value may keep track of the angular position of the rotation mechanism at all times. In some embodiments, these changes of count may be consolidated to create a single signal that is called the "master trigger". It may be achieved by programming the counters to output a digital signal every time the count changes. Alternatively, a digital edge detection circuitry may be used, which are used in many commercially available data acquisition cards. The "master trigger" may be further divided in frequency simply to have a way to reduce the number of triggers that the RF subsystem gets. In other words, a frequency divisor may be employed within the counter apparatus such that only every $N^{th}$ trigger leads to an acquisition measurement.

Figure 19:
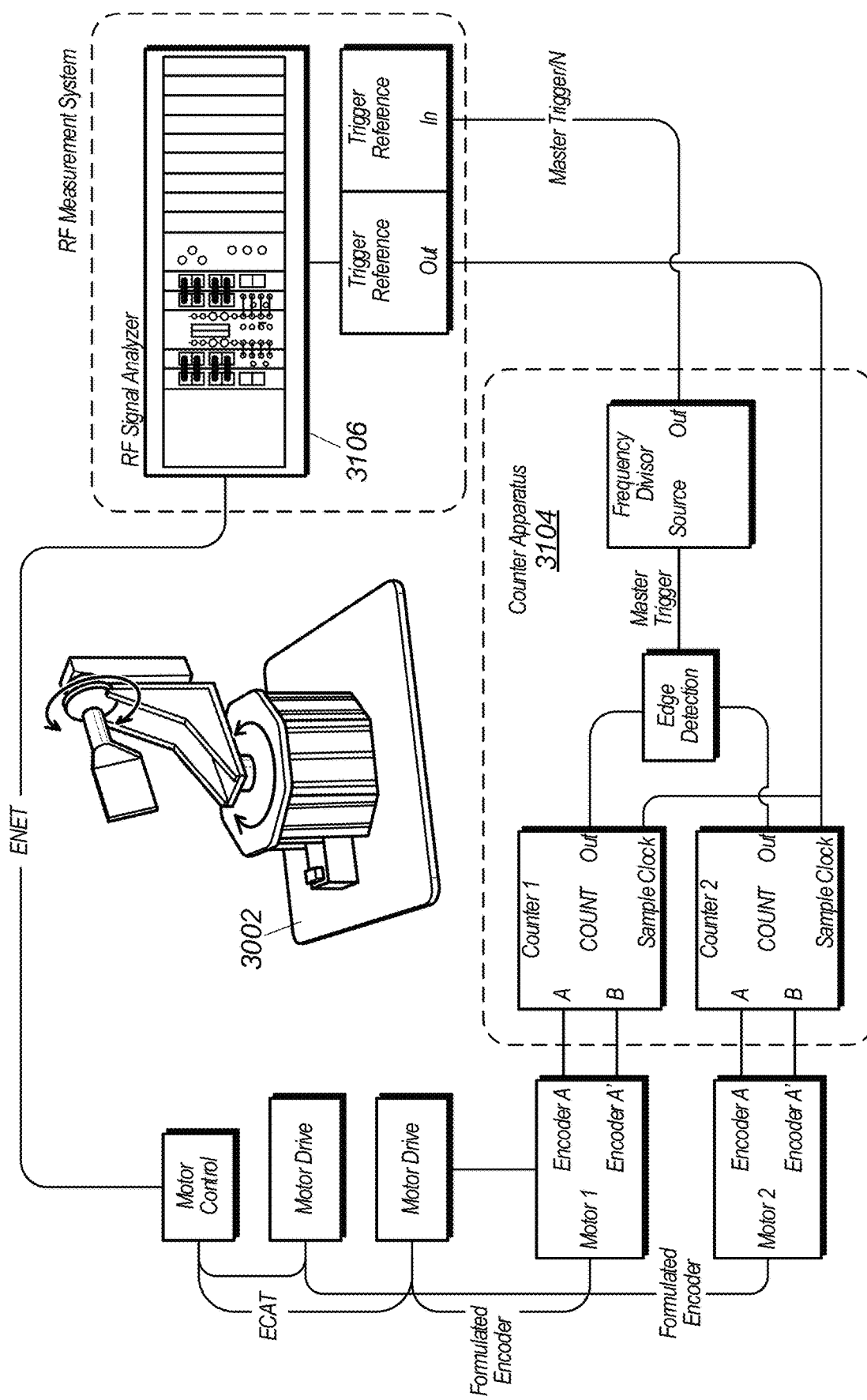
FIG. 19 is a system diagram illustrating the components and connections of a hardware timed over-the-air (OTA) test system, according to some embodiments.

FIG. 19—Connection Diagram of Semiconductor Test System

FIG. 19 is a system diagram illustrating the components and connections of a semiconductor test system, alternatively referred to as an antenna characterization system (ACS), according to exemplary embodiments. As illustrated, the radio frequency (RF) measurement system, comprising an RF signal analyzer coupled to reference triggers in and out, may be coupled through an ethernet (ENET) connection to the motor control device that controls the motion of the motors of the adjustable positioner. The motor control device may comprise a motion control processor that is configure to direct motion of the adjustable positioner. For example, the motor control device may be a National Instruments IC-3120 device, or another type of motor control device, according to various embodiments. As illustrated, the motor control may communicate with two motor drives through an ethernet for control automation technology (ECAT) connection to direct the motion of the motor drives. The two motor drives may be configured to rotate the adjustable positioner according to two orthogonal axes of rotation, as illustrated by the two circular arrows on the adjustable positioner 3002. Each of the motor drives may be in turn coupled to the counter apparatus, each through two encoder channels A and A'. As described in greater detail above in reference to the quadrature encoder scheme, the two signaling channels between the motor drives of the adjustable positioner and the counter apparatus may enable a determination of the direction of motion of the adjustable positioner.

The counter apparatus may contain two separate counters (e.g., corresponding to the two axes of rotation of the adjustable positioner), and may additionally contain one or more edge detection apparatuses to detect the edge of a modification instance of one or the other of the counters. As described in greater detail below, the edge detection apparatus may transmit a master trigger to one or more frequency divisors, to potentially lead to a measurement acquisition. The frequency divisor may be configured to only allow every $N^{th}$ master trigger to lead to a measurement acquisition. For example, the frequency divisor may keep a running tally of received master triggers, and may transmit every $N^{th}$ master trigger to the RF measurement system to trigger the RF signal analyzer to perform a measurement acquisition.

As illustrated, the RF signal analyzer may employ a dual "trigger reference in" and "trigger reference out" system to ensure that samples are not taken from positions where there is no acquisition. For example, when the counter apparatus sends an acquisition trigger to the "trigger reference in" (TRI) port of the RF signal analyzer, the TRI may forward the acquisition trigger to the trigger reference out (TRO) only when the RF signal analyzer initiates a measurement acquisition of the DUT, and may transmit a reference trigger out back to the counter apparatus, to inform the counter apparatus that a measurement acquisition has been initiated. On the other hand, if the RF signal analyzer has not completed a previously initiated measurement acquisition when the TRO forwards the acquisition trigger to the RF signal analyzer (e.g., if the RF is still conducting an ongoing, previously initiated measurement acquisition when the acquisition trigger is received), the TRO may refrain from forwarding the reference trigger out to the counter apparatus. In this case, a measurement was not initiated during the current value of the counter (or counters), and the counter apparatus may likewise not forward the current value of the counter (or counters) to the computer for correlation with measurement results, avoiding errors in the correlation calculation.

Figure 20:
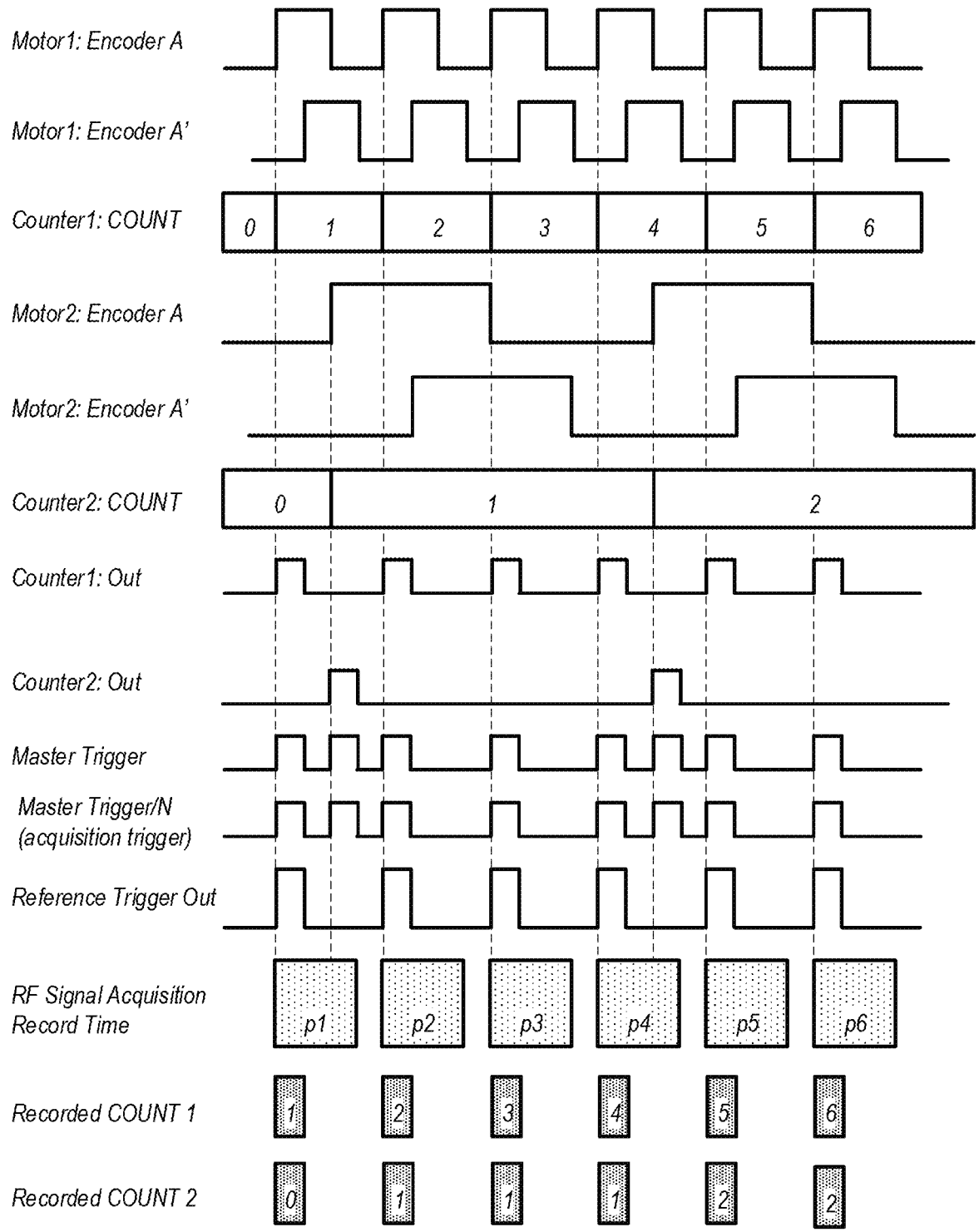
FIG. 20 illustrates a timing diagram of a sequence of signals and counter transitions in an OTA antenna characterization process; according to some embodiments.

FIG. 20 illustrates a timing diagram of a sequence of signaling and counter modifications in an exemplary acquisition process. As illustrated, a first motor (e.g., a motor directing motion of the adjustable positioner about a first axis of rotation) transmits periodic signals through two channels, $A_1$ and $A_1'$. The signals are transmitted to a first counter of the counter apparatus ("Counter1"), which increments the counter at the front edge of each instance of a signal from motor 1's encoder $A_1$ channel. Note that the counter is incremented in this case because the encoder $A_1$ channel leads the encoder $A_1'$ channel by 90 degrees. Conversely, if the encoder $A_1'$ channel led the encoder $A_1$ channel by 90 degrees, the counter would be decremented at the back edge of each signal from the encoder $A_1$ channel.

Similarly, motor 2 (directing rotation of the adjustable positioner around a second axis, orthogonal axis of rotation) transmits signals through two channels, $A_2$ and $A_2'$, to the second counter of the counter apparatus, which likewise modifies the second counter according to the leading edge of the channel $A_2$ signals. As used herein, the term "channel" may refer to either of the multiple quadrature encoder channels corresponding to a particular motor, or respective channels of the two motors. According to exemplary embodiments, there may be four channels used for transmitting signals by the adjustable positioner: $A_1$, $A_1'$, $A_2$, and $A_2'$. More generally, any number of motors with respective channels, and any number of channels per each motor may be used, as desired. Each of the counter outputs their respective first and second counters which are combined to a master trigger. In FIG. 20, the frequency divisor is a trivial N=1 frequency divisor, such that every input master trigger leads to the output of an acquisition trigger. Alternatively, if an N=2 frequency divisor was employed (not illustrated in FIG. 20), only every other signal in the master trigger would lead to the output of an acquisition trigger.

FIG. 20 additionally illustrates the duration of a sequence of measurement acquisitions. Additionally, it is illustrated how when an acquisition trigger is sent to the RF signal analyzer while a previous measurement acquisition is still ongoing (e.g., the second acquisition trigger is sent while the p1 acquisition is still ongoing), a reference trigger out is not sent to the counter apparatus. In this manner, the recorded counts 1 and 2 will each correspond to a unique measurement acquisition, and counts 1 and 2 will not be recorded when a measurement acquisition does not take place. In post processing, a computer may then correlate the result of each measurement acquisition with a recorded count of each of counters 1 and 2, to determine the position of the adjustable positioner corresponding to each measurement result. In other words, for each RF measurement acquisition, corresponding measurements may be computed (described as $p_i$ in FIG. 20), the counter values may be stored at the same time, and a table may be populated. Table 1, below, illustrates an example.

TABLE 1

Example Results of OTA Antenna Characterization

| Azimuth Count | Elevation Count | Counts/Degree | Azimuth Angle | Elevation Angle | RF Power |
|---|---|---|---|---|---|
| 1 | 0 | 10 | 0.1 | 0 | p1 |
| 2 | 1 | 10 | 0.2 | 0.1 | p2 |
| 3 | 1 | 10 | 0.3 | 0.1 | p3 |
| 4 | 1 | 10 | 0.4 | 0.1 | p4 |
| 5 | 2 | 10 | 0.5 | 0.2 | p5 |
| 6 | 2 | 10 | 0.6 | 0.2 | p6 |
| 23 | 5 | 10 | 2.3 | 0.5 | p7 |
| 34 | 5 | 10 | 3.4 | 0.5 | p8 |
| 45 | 15 | 10 | 4.5 | 1.5 | p9 |
| 56 | 15 | 10 | 5.6 | 1.5 | p10 |
| 67 | 20 | 10 | 6.7 | 2 | p11 |
| 78 | 24 | 10 | 7.8 | 2.4 | p12 |
| 89 | 28 | 10 | 8.9 | 2.8 | p13 |
| 100 | 32 | 10 | 10 | 3.2 | p14 |
| 111 | 36 | 10 | 11.1 | 3.6 | p15 |
| 122 | 40 | 10 | 12.2 | 4 | p16 |
| 133 | 44 | 10 | 13.3 | 4.4 | p17 |
| 144 | 48 | 10 | 14.4 | 4.8 | p18 |
| 155 | 52 | 10 | 15.5 | 5.2 | p19 |
| 166 | 56 | 10 | 16.6 | 5.6 | p20 |
| 177 | 60 | 10 | 17.7 | 6 | p21 |
| 188 | 64 | 10 | 18.8 | 6.4 | p22 |
| 199 | 68 | 10 | 19.9 | 6.8 | p23 |
| 210 | 72 | 10 | 21 | 7.2 | p24 |
| 221 | 76 | 10 | 22.1 | 7.6 | p25 |
| 232 | 80 | 10 | 23.2 | 8 | p26 |
| 243 | 84 | 10 | 24.3 | 8.4 | p27 |
| 254 | 88 | 10 | 25.4 | 8.8 | p28 |
| 265 | 92 | 10 | 26.5 | 9.2 | p29 |

In some embodiments, a translation from counter values to [Azimuth, Elevation] pair may be computed. This may be dependent on the mechanical design of the positioner and the feedback mechanism.

Advantageously, embodiments described herein avoid utilizing software interactions to perform the sequence of orientations of the AUT and the associated measurement acquisitions. An important distinction of embodiments described herein is that the feedback mechanism (counters) are being sampled at the time of the RF measurement, which may achieve better accuracy than other types of synchronization.

An additional improvement of embodiments described in regard to the speed of the AUT characterization process is that adjustable positioner may transition between a plurality of orientations of the AUT continuously (i.e., without halting the motion between orientations). In software triggered implementations, the error between the hardware and the software triggering is typically too large to enable repeatable result with a continuous, non-halting motion of the adjustable positioner. Because the system is connected on hardware, latency and error are sufficiently low such to allow repeatable results without halting the motion of the positioner during the AUT characterization process.

Figure 21:
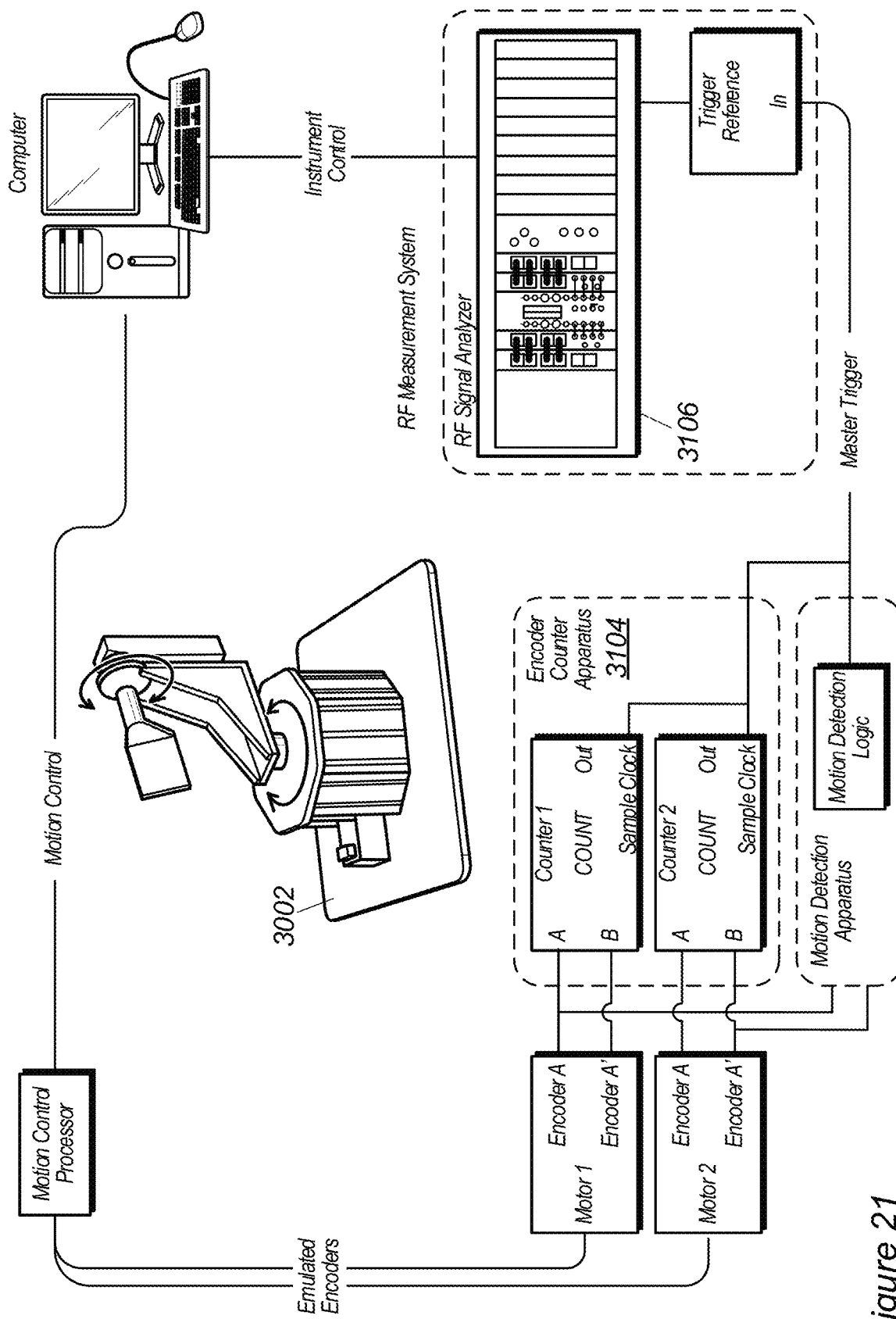
FIG. 21 is a system diagram illustrating the components and connections of a hardware timed over-the-air (OTA) test system including a computer, according to some embodiments.

FIG. 21 is a similar system diagram to FIG. 19, where the instrument controlling computer is included. In particular, FIG. 21 illustrates how, in some embodiments, a computer may be used to direct the measurement acquisition process described in FIG. 19. Additionally, FIG. 21 illustrates a motion detection apparatus which may receive signals from motors 1 and 2 as well as from the counter apparatus to determine (e.g., by the motion detection logic) when to transmit a master trigger (i.e., an acquisition trigger) to the RF measurement system. In some embodiments, the performing of the measurement acquisition process may be controlled by a programmable hardware element of the computer. In other words, in some embodiments, at least some of the methods disclosed herein may be implemented and/or controlled in programmable hardware, such as a field programmable gate array (FPGA). Other configurations of the system diagram are also possible. For example, one or more of the counter apparatus, the motor control, the motion detection apparatus, and the RF signal analyzer/RF measurement system may be included as software within the computer, or they may be separate hardware elements (e.g., such as PXI cards in a modular chassis, for example). In general, the structural elements of an RF measurement system, a counter apparatus, and motor control may take a broad variety of forms in either software or hardware. The terms "RF measurement system", "counter apparatus", "motor control", and "motion detection apparatus" are intended to be functional descriptors of the role played by the respective entities in the measurement acquisition process, and are not intended to limit their implementation in various embodiments to a specific type of hardware or software.

Figure 22:
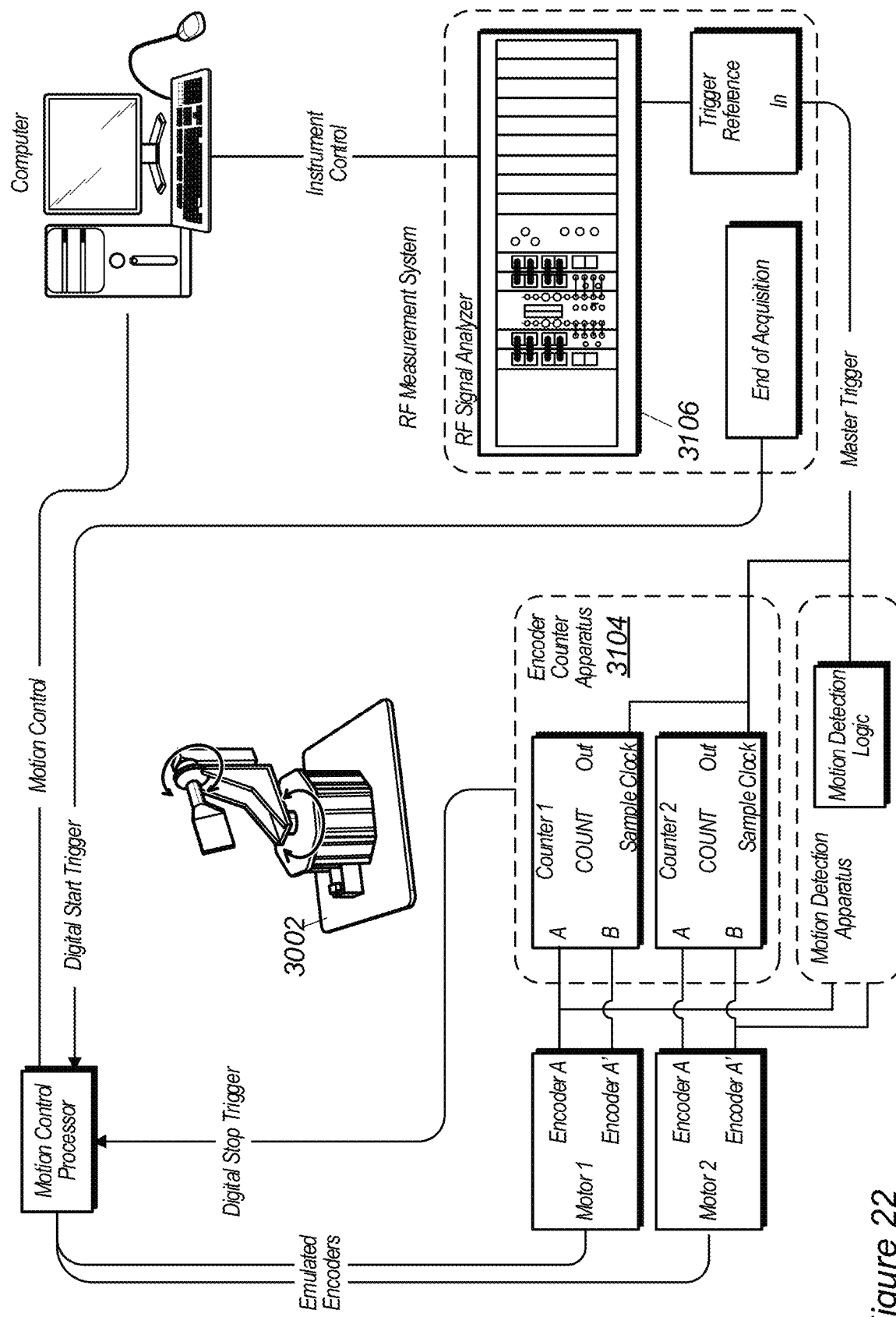
FIG. 22 is a system diagram illustrating the components and connections of a hardware timed over-the-air (OTA) test system incorporating start/stop triggers, according to some embodiments.

FIG. 22 is a system diagram similar to FIG. 21 that additionally illustrates a capability of the system to sequentially start and stop the motion of the adjustable positioner during the measurement acquisition process, according to some embodiments. In some embodiments, the duration of each measurement acquisition may be long enough such that it may be desirable for the adjustable positioner to temporarily halt the motion of the DUT while each measurement is being acquired, and transition to a subsequent orientation after completion of the measurement acquisition. Alternatively, or additionally, it may be desirable to perform a plurality of measurements at each orientation of the DUT (e.g., it may be desirable to measure transmission properties of the DUT at a plurality of transmission power levels, or at a plurality of different frequencies, for each orientation, among other possibilities), and it may be desirable for the adjustable positioner to remain at a particular orientation until the plurality of measurement acquisitions are complete.

As illustrated in FIG. 22, the counter apparatus may transmit a digital stop trigger to the motion control processor concurrently with every transmission of an acquisition trigger to the RF measurement system, so that the motion control processor halts the motion of the adjustable positioner at the initiation of each measurement acquisition. In some embodiments, the counter apparatus may wait a predetermined period of time after transmitting the digital stop trigger for the adjustable positioner to settle into a stable position before transmitting the acquisition trigger to the RF measurement system. Alternatively, the counter apparatus may transmit the digital stop trigger to the motion control processor upon reception of a reference trigger out signal from the RF measurement system, so that the counter apparatus will only instruct the motion control processor to halt the motion of the adjustable positioner when an acquisition trigger has actually led to a measurement acquisition by the RF measurement system.

As further illustrated in FIG. 22, the RF measurement system may transmit a digital start trigger to the motion control processor to resume motion when the RF measurement system has ended (i.e., completed) its measurement acquisition. In response the motion control processor may direct the adjustable positioner to transition to a subsequent orientation in the sequence. Advantageously, the implementation of start/stop triggers may improve flexibility regarding the number and duration of measurements acquired on a single position. Additionally, utilization of hardware-timed signaling between the structural elements of the measurement acquisition system may reduce latency that would otherwise be introduced through software interaction.

Figure 23:
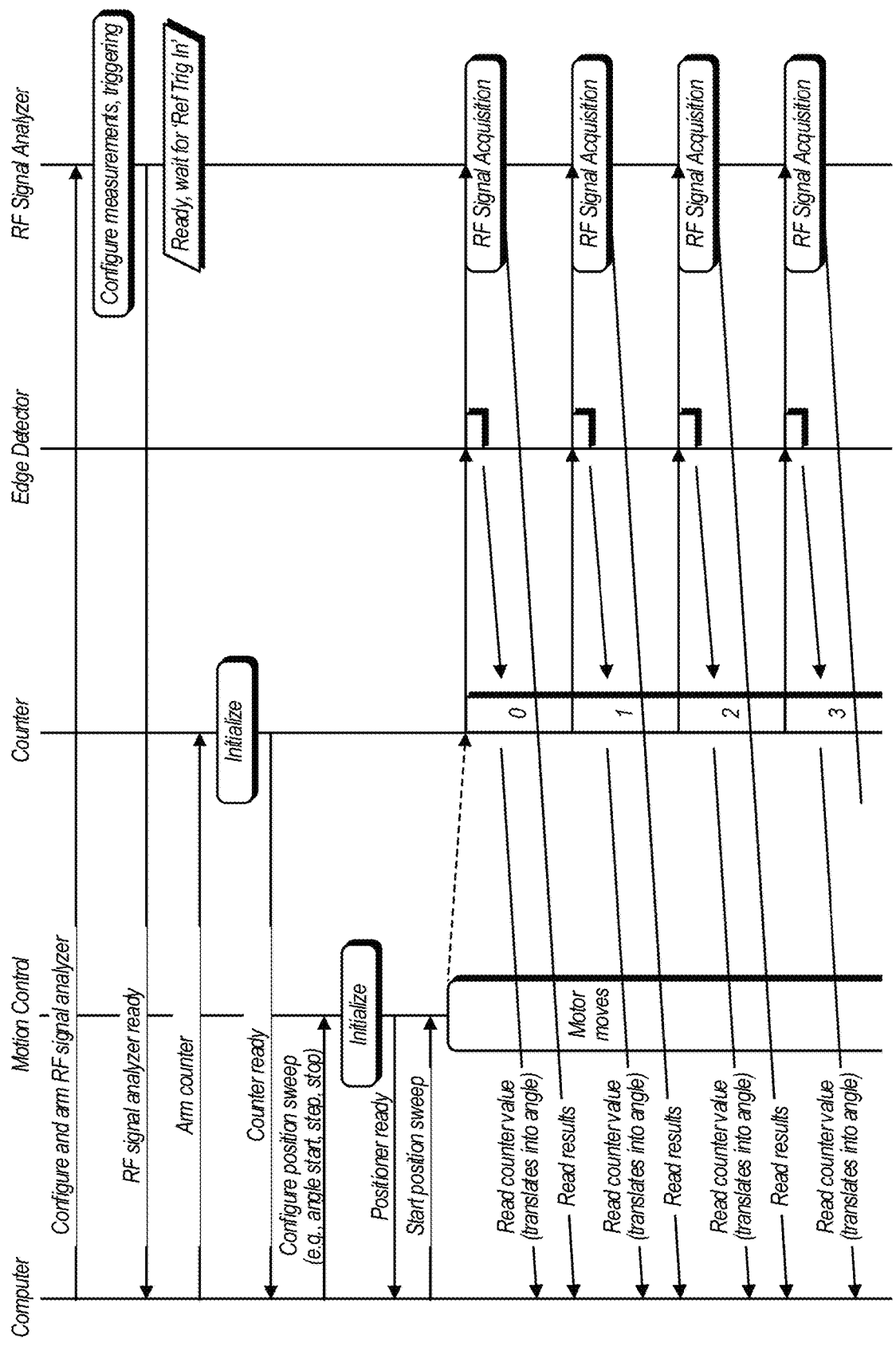
FIG. 23 is a communication flow diagram illustrating a simplified method for conducting coordinated OTA antenna measurements, according to some embodiments.
Figure 24:
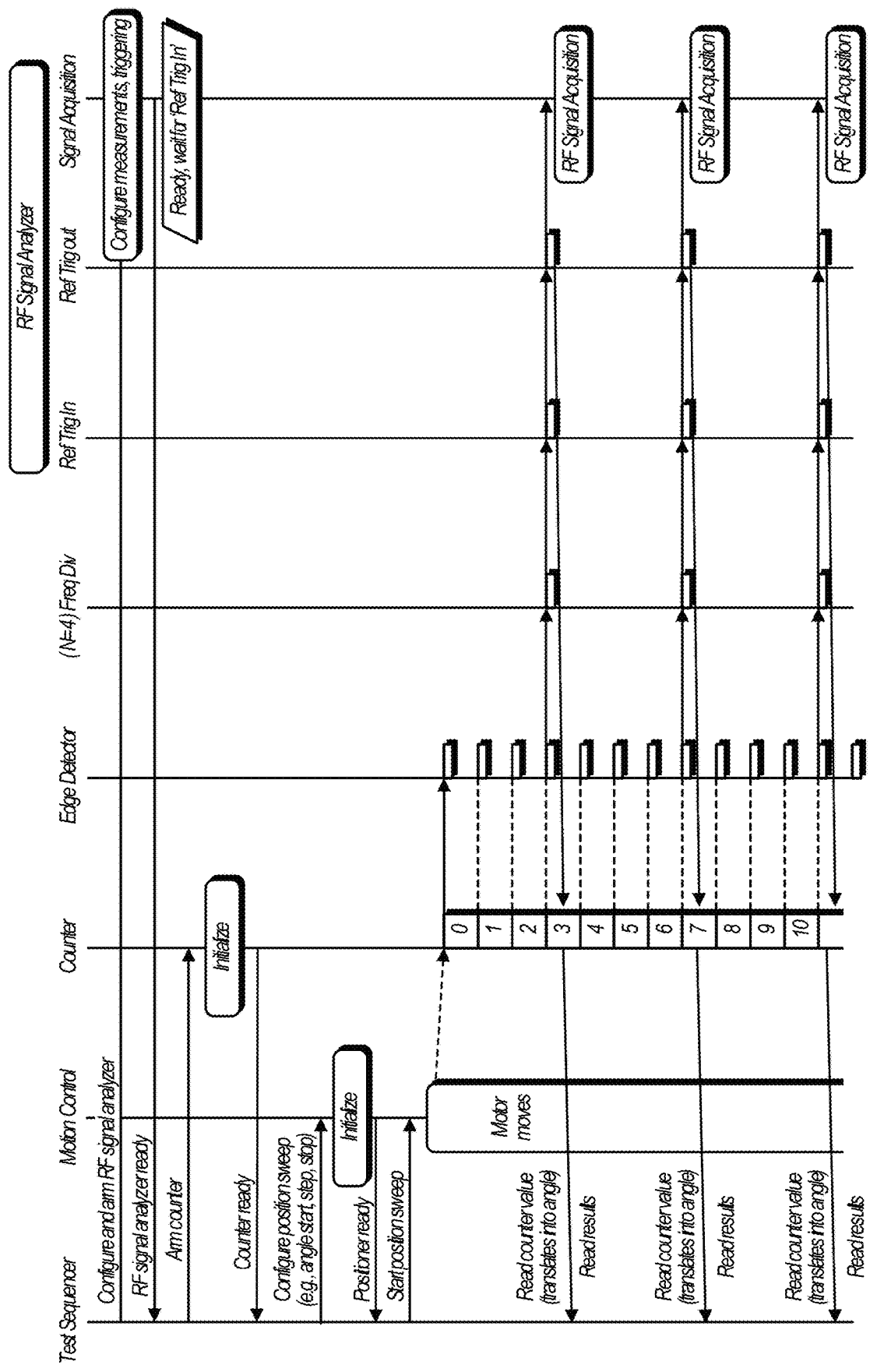
FIG. 24 is a communication flow diagram illustrating a method for conducting coordinated OTA antenna measurements including reference triggers used by a radio frequency signal analyzer, according to some embodiments.
Figure 25:
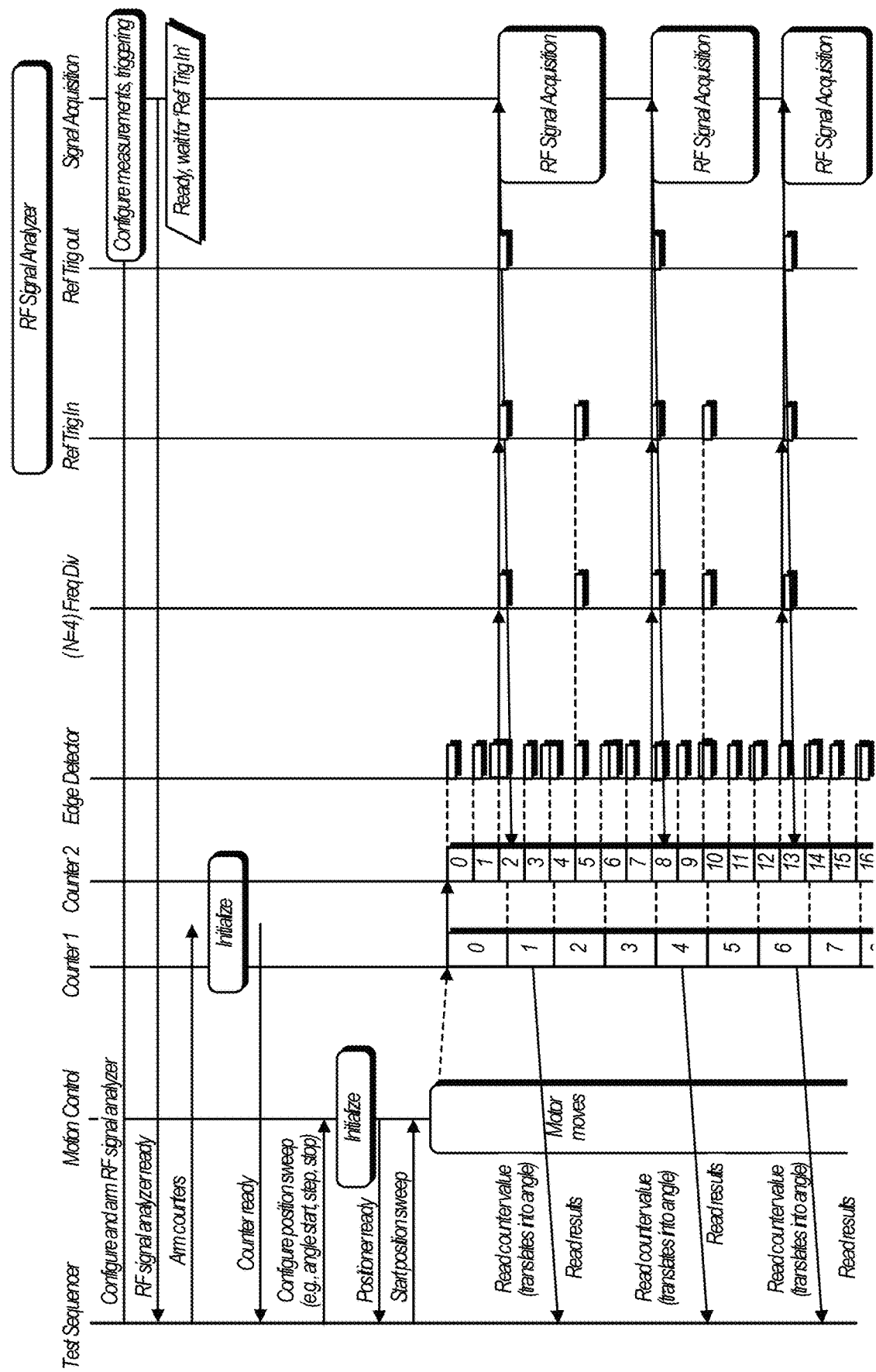
FIG. 25 is a communication flow diagram illustrating a method for conducting coordinated OTA antenna measurements where some acquisition triggers overlap with an ongoing measurement acquisition and do not trigger a subsequent acquisition, according to some embodiments.

FIGS. 23-25—Communication Flow Diagrams for Measurement Acquisition

FIG. 23 is a communication flow diagram illustrating a simplified method for conducting coordinated OTA antenna measurements, according to some embodiments. As illustrated, a computer may configure and arm a radio frequency (RF) signal analyzer for an upcoming measurement acquisition process of a device-under-test (DUT) or an antenna-under-test (AUT). The RF signal analyzer may configure its measurement acquisition and triggering mechanisms, and wait for a "Ref Trig In" to conduct a measurement acquisition. The RF signal analyzer may inform the computer when it is ready and configured. The computer may also arm the counter apparatus, which may be initialized and may inform the computer after it has been initialized. The computer may also configure the motion control apparatus with a position sweep protocol, and the motion control apparatus may inform the computer when it and the adjustable positioner are ready to start a position sweep. For example, the computer may inform the motion control apparatus of a starting position for one or more angles of the adjustable positioner, as well as a sequence of motion sweeps of the one or more motors through a sequence of different orientations of the DUT.

The computer may then initialize the position sweep, and the motion control apparatus may direct the adjustable positioner to begin orienting the DUT through a plurality of different orientations. The adjustable positioner may continually transition between orientations, without halting the motion of the positioner between orientations. In response to the adjustable positioner reaching each of the plurality orientations, signals through one or more channels may be automatically sent from the adjustable positioner to the counter apparatus. The counter apparatus may use these signals to modify one or more counters corresponding to one or more respective axes of rotation of the adjustable positioner. For example, the counter apparatus may increment or decrement its one or more counters based on the signals received (e.g., according to the quadrature encoding scheme described above). The counter apparatus may transmit the modified counter to the computer, which may read the counter value and translate the value into an angle and orientation of the adjustable positioner. The counter apparatus may employ an edge detector, to detect either the front or back edge of a counter (e.g., depending on whether the counter is incremented or decremented), to determine the precise instant when the counter was modified.

In response to an edge detection, the counter apparatus may transmit an acquisition trigger to the RF signal analyzer, which may cause the RF signal analyzer to perform a measurement acquisition of the DUT (denoted as "RF signal acquisition" in FIG. 23). The RF signal analyzer may transmit the result of the measurement acquisition to the computer, which may read the result and correlate the result with the received counter value to determine the orientation of the adjustable positioner at the time of the measurement. After a sequence of many such correlated measurement acquisitions, the computer may populate a table of measurement results and their associated DUT orientations, and may store the table in memory.

FIG. 24 is a communication flow diagram illustrating a method for conducting coordinated OTA antenna measurements including reference triggers used by a radio frequency signal analyzer, according to some embodiments. FIG. 24 is similar to FIG. 23, but FIG. 24 explicitly describes the role played by the frequency divisor of the counter apparatus and the reference triggers in and out of the RF signal analyzer. As illustrated, the frequency divisor filters out every $N^{th}$ acquisition trigger received from the counter apparatus (every $4^{th}$ acquisition trigger in the illustrated example of FIG. 24, though other values of N are also possible). As illustrated, every $4^{th}$ acquisition trigger is forwarded to the reference trigger in ("Ref Trig In") port of the RF signal analyzer. The Ref Trig In forwards the acquisition trigger to the Ref Trig Out port, which in turn triggers a measurement acquisition. Importantly, if a measurement acquisition is initiated, the Ref Trig Out also forwards a trigger back to the counter apparatus, which instructs the counter apparatus to transmit the current value of the counter to the computer for correlation with the measurement result. In this manner, a counter value is transmitted to the computer for correlation with a measurement result only when a measurement acquisition has been initiated.

FIG. 25 is a communication flow diagram illustrating a method for conducting coordinated OTA antenna measurements where some acquisition triggers overlap with an ongoing measurement acquisition and do not trigger a subsequent acquisition, according to some embodiments. FIG. 25 is similar to FIGS. 23 and 24, but FIG. 25 illustrates explicitly how the method may be utilized to accommodate two counters corresponding to two different axes of rotation of the adjustable positioner. Additionally, FIG. 25 illustrates how the described methods may accommodate a circumstance where an acquisition trigger is received by RF signal analyzer before a previously initiated and ongoing measurement acquisition is completed.

As illustrated, FIG. 25 shows that counter 1 and counter 2 (corresponding respectively to two different axes of rotation of the adjustable positioner) may separately be incremented at two different (and potentially non-commensurate) rates. As illustrated, a modification to either counter 1 or counter 2 may lead the edge detector to transmit an acquisition trigger to the frequency divisor, and the frequency divisor may forward every $N^{th}$ acquisition trigger received to the Ref Trig In of the RF signal analyzer to perform a measurement acquisition. In the illustrated example of FIG. 25, the first such acquisition trigger received by Ref Trig Out leads to a measurement acquisition, the result of which is transmitted to the computer, and additionally instructs the counter apparatus to transmit the current value of counter 1 and counter 2 to the computer for correlation with the respective measurement result.

The second acquisition trigger that is transmitted to Ref Trig In, however, is received by Ref Trig Out before the first RF signal acquisition is completed (i.e., it is received during a previously initiated and ongoing RF measurement acquisition). Accordingly, Ref Trig Out does not initiate a subsequent measurement acquisition, and the counter apparatus is not instructed to transmit the current values of counter 1 and counter 2 to the computer for correlation with measurement results. In this manner, even though the sequence of acquisition trigger transmissions by the counter apparatus to the RF signal analyzer may be aperiodic (e.g., because the rate of transmissions depends on the convolution of two different and potentially non-commensurate periods. Namely, the two periods of counter modification of counters 1 and 2), each set of counter values received by the computer will be correlated to a single corresponding measurement result.

The following numbered paragraphs describe additional embodiments of the invention.

In some embodiments, a semiconductor test system (STS), comprises an anechoic chamber, a counter apparatus, a radio frequency (RF) signal analyzer coupled to one or more receive antennas and the counter apparatus, an adjustable positioner coupled to the counter apparatus, and a computer comprising a processor and coupled to each of the adjustable positioner, the counter apparatus, and the RF signal analyzer. The one or more receive antennas may be positioned inside the anechoic chamber, and the RF signal analyzer may be configured to acquire RF measurements made by the one or more receive antennas of transmissions of an antenna under test (AUT) or a device-under-test (DUT). The computer may initialize a measurement process on the DUT or AUT according to the following sequence of steps.

In some embodiments, an apparatus configured for inclusion within a computer, wherein the computer is comprised within a semiconductor test system (STS), comprises a memory and a processing element in communication with the memory. The memory may store program instructions that are executable by the processing element to cause the computer and the STS to initialize a measurement process on the DUT or AUT according to the following sequence of steps.

The STS may initialize a measurement process on the AUT by causing the adjustable positioner to continually transition the AUT inside the anechoic chamber through a plurality of orientations without halting the motion of the adjustable positioner between orientations. Said continually transitioning the AUT through the plurality of orientations may be performed at a speed such that the time between successive signal transmissions through each of the one or more channels is greater than an acquisition time of each of the RF measurements.

The adjustable positioner may be configured to automatically transmit a signal through one or more channels to the counter apparatus in response to the adjustable positioner positioning the AUT according to each of the plurality of orientations. The adjustable positioner may provide the signals to the counter apparatus via direct hardware signaling. In other words, the adjustable positioner may communicate the signals directly to the counter apparatus, without introducing software latency. Rather, the signals may be communicated directly through a wired or wireless connection, and the signals may automatically cause the counter apparatus to perform the following steps.

The one or more channels may comprise a first channel and a second channel of a quadrature encoder scheme, wherein said modifying the first counter comprises incrementing or decrementing the first counter, and wherein a relative phase between respective signals of the first channel and the second channel determines whether the counter apparatus increments or decrements the first counter.

For embodiments, where modifying the first counter comprises incrementing or decrementing the first counter, the counter apparatus may comprise an edge detector configured to detect the front edge in time of an incremented first counter and the back edge in time of a decremented first counter. In these embodiments, said transmitting the modified first counter to the computer and said transmitting the first acquisition trigger to the RF signal analyzer may be performed by the edge detector in response to detecting the front edge of the incremented first counter or the back edge of the decremented first counter.

In response to receiving the signals from the adjustable positioner through the one or more channels, the counter apparatus may be configured to modify a first counter, transmit the modified first counter to the computer, and transmit a first acquisition trigger to the RF signal analyzer, wherein said modifying the first counter, transmitting the modified first counter, and transmitting the first acquisition trigger occur a plurality of times at different respective orientations of the AUT. Similar to the connection between the adjustable positioner and the counter apparatus, the counter apparatus may the first acquisition triggers to the RF signal analyzer through direct hardware signaling, such that only a very small (e.g., microseconds or smaller) amount of latency is introduced in communicating the acquisition trigger to the RF signal analyzer.

In some embodiments, in response to receiving the signals from the adjustable positioner, the counter apparatus may modify a second counter, transmit the modified second counter to the computer, transmit a second acquisition trigger to the RF signal analyzer. Said modifying the second counter, transmitting the modified second counter, and transmitting the second acquisition trigger may occur a plurality of times at different respective orientations of the AUT. The second counter may be associated with a different axis of rotation of the adjustable positioner than the first counter.

The counter apparatus may comprise a frequency divisor, and said transmitting the modified first counter to the computer and said transmitting the first acquisition trigger to the RF signal analyzer may be performed by the frequency divisor for every $N^{th}$ modified first counter and every $N^{th}$ first acquisition trigger, where N is a positive integer.

In some embodiments transmitting the modified first and second counters to the computer and said transmitting the first and second acquisition triggers to the RF signal analyzer is performed by the frequency divisor for every $N^{th}$ modified first or second counter and every $N^{th}$ first or second acquisition trigger, where N is a positive integer. In other words, the frequency divisor may count reception of both first and second acquisition triggers, and may transmit every $N^{th}$ acquisition trigger, regardless of whether the $N^{th}$ acquisition trigger is a first or second acquisition trigger.

The RF signal analyzer may be configured to acquire an RF measurement of transmissions of the AUT and relay the result of the RF measurement to the computer in response to receiving each of the plurality of first acquisition triggers.

In some embodiments, said acquiring an RF measurement by the RF signal analyzer is not initiated when one of the plurality of first acquisition triggers is received during a previously initiated and ongoing RF measurement acquisition. In these embodiments, the RF signal analyzer may be further configured to transmit a reference trigger to the counter apparatus in response to initiating each RF measurement acquisition, and said transmitting the modified first counter to the computer by the counter apparatus may be performed further in response to the counter apparatus receiving the reference trigger from the RF signal analyzer. In these embodiments, the RF signal analyzer may refrain from transmitting the reference trigger to the counter apparatus when reception of a respective first acquisition triggers does not result in initiation of acquisition of the RF measurement (i.e., when an acquisition trigger is received by the RF signal analyzer before a previous ongoing acquisition is complete).

The computer may be further configured to correlate the modified first counters received from the counter apparatus with the results of the RF measurements to determine an orientation of the plurality of orientations of the AUT corresponding to each of the results of the RF measurements, and output a correlated list of results of the RF measurements and their respective orientations of the AUT. The list of results may be stored in a memory.

Accuracy of RF Measurements

Accuracy of the recorded positions of the adjustable positioner may be adversely affected by several factors. Depending on the encoders resolution and the N-decimation factor, the exact angle might not fall in an exact point. This may cause some small correlation issues with the other (second) rotation mechanism as the data comparison may have a small angle deviation error. Additionally, there may be a delay between the count number and the RF acquisition. However, even if this is a significant error, it is fixed and may be corrected during calibration of the delays of the system.

Figure 26:
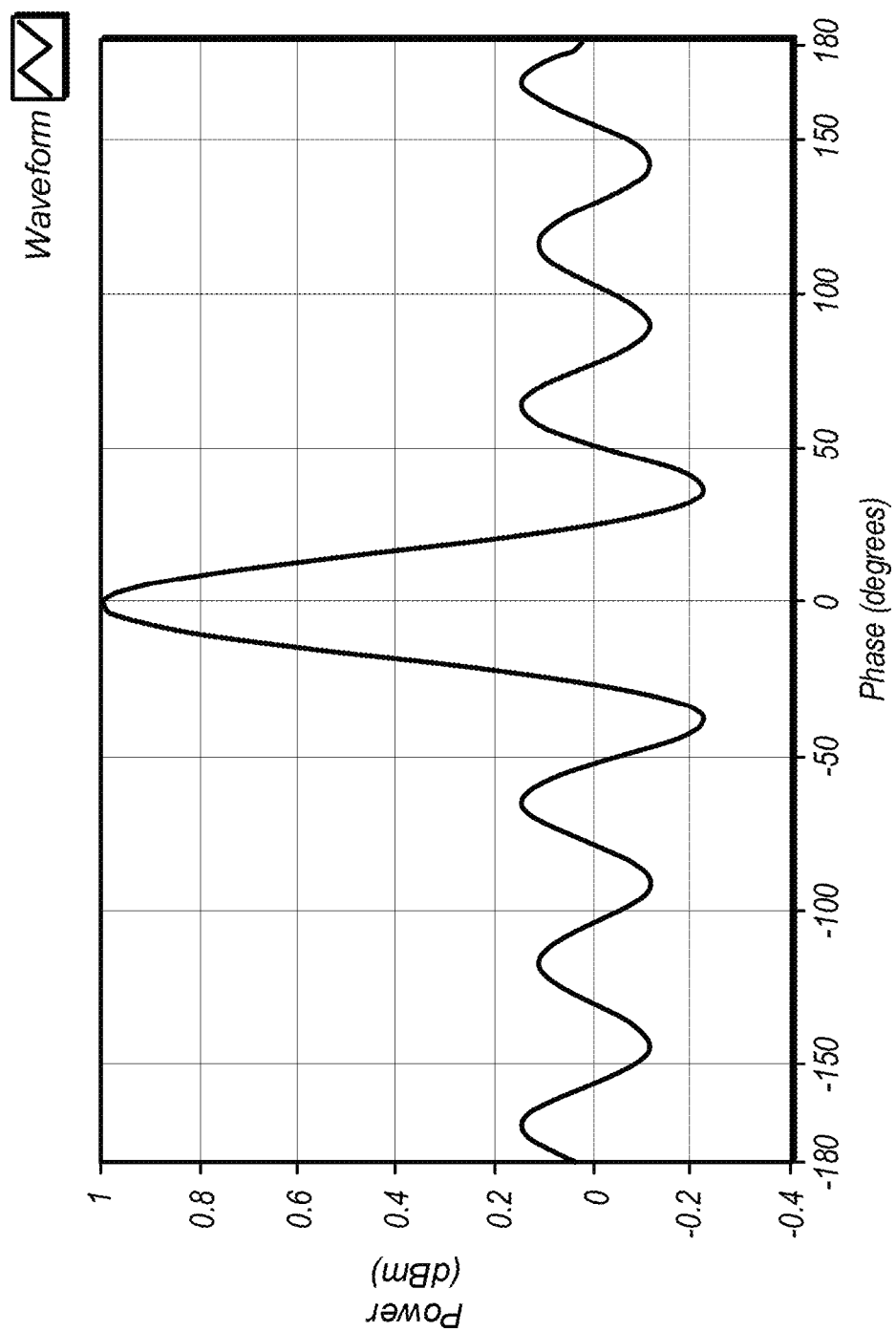
FIG. 26 is a simulated illustration of an antenna transmission power profile simulated as a sinc function, according to some embodiments.
Figure 27:
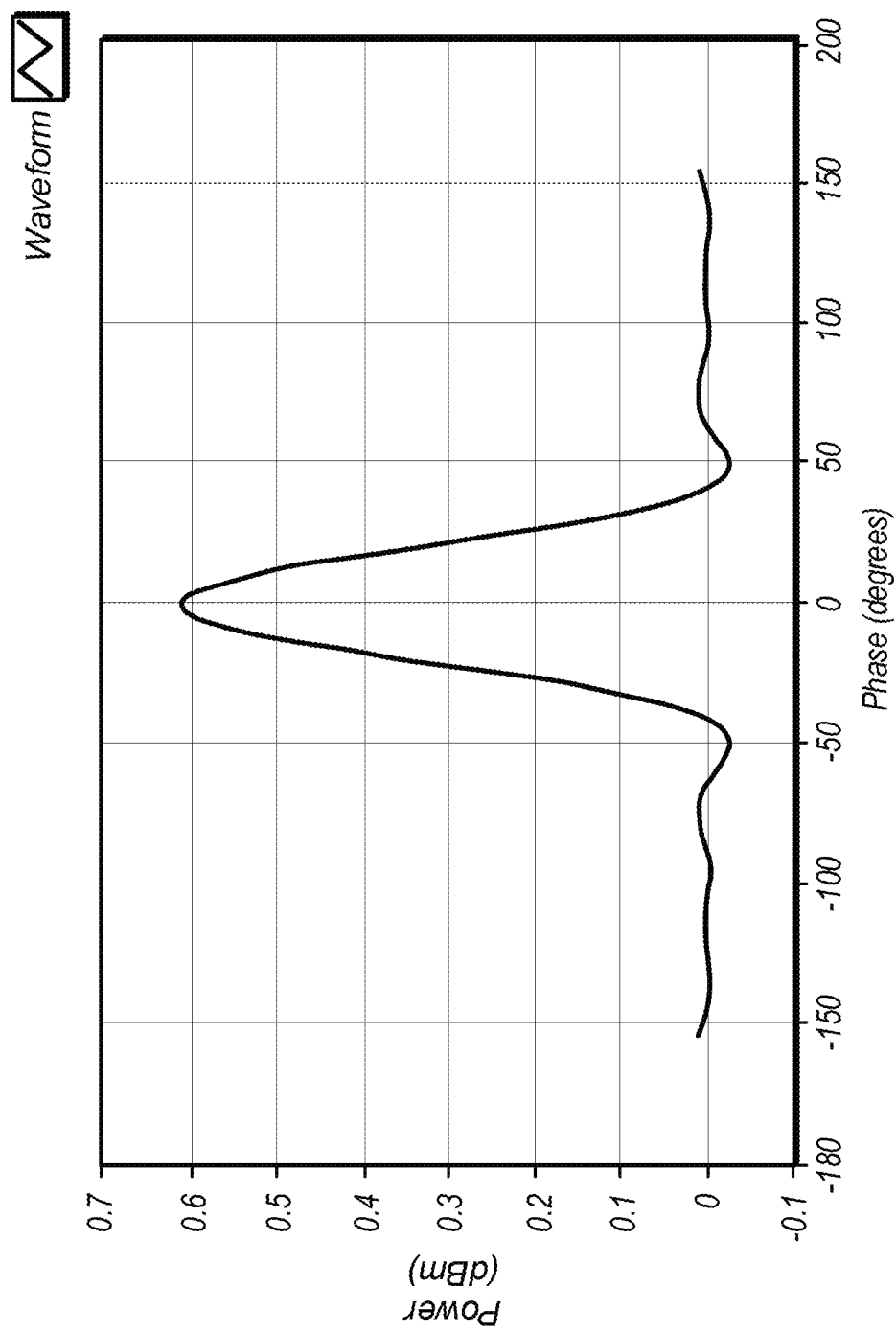
FIG. 27 is an illustration of distorted measurement results when the angular velocity is much larger than the inverse of the acquisition time, according to some embodiments.

In some embodiments, the largest error may be the RF acquisition duration compared to the angular velocity of the adjustable positioner. Consider a perfect simulation of the power of an antenna simulated as a sinc function, as illustrated in FIG. 26. The relative magnitudes of the angular velocity and the inverse of the acquisition time may affect the measurement of the power. If angular velocity $\omega_r$ is much greater than the inverse of the acquisition time, the ideal power profile shown in FIG. 26 may be distorted, as shown in FIG. 27. FIG. 27 illustrated distorted measurement results when the angular velocity is 50× larger than the inverse of the acquisition time.

Figure 28:
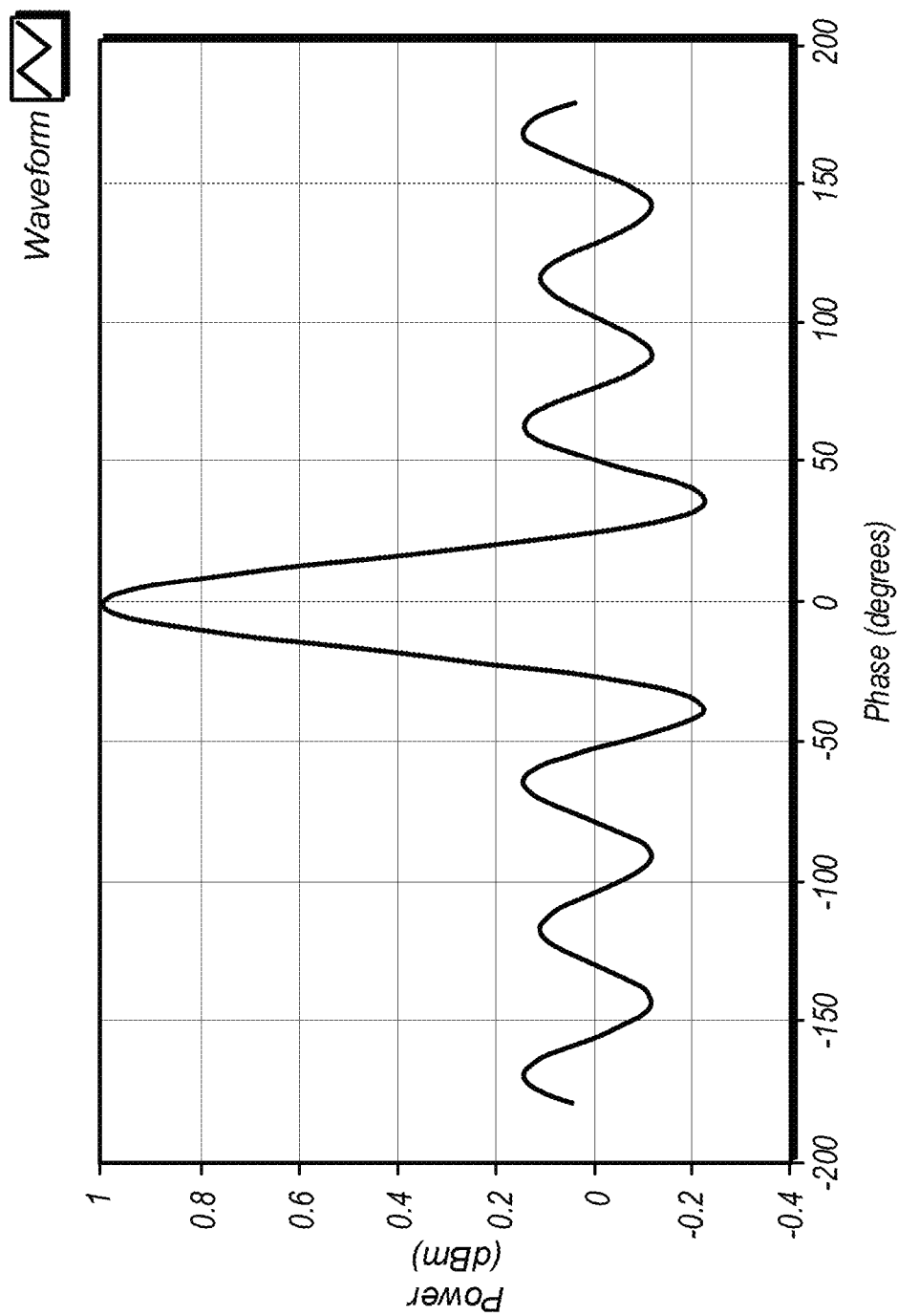
FIG. 28 is an illustration of high-fidelity measurement results when the angular velocity is comparable to the inverse of the acquisition time, according to some embodiments.

Simulation results show that when the angular velocity is close to the inverse of the RF acquisition time, then the results are well correlated, as illustrated in FIG. 28. The mean squared error for FIG. 28 is less than 5e-6.

Power is a common measurement in OTA antenna characterization. Power may typically be computed for a mmWave measurement with about 100 μs of raw data. This means that the angular velocity may be as high as approximately 10,000 degrees per second without introducing significant distortion. In turn, this means that a very detailed grid of 1296 points (half sphere every 5 degrees on azimuth and elevation), may be computed in about 1.3 seconds using an appropriate trajectory. The number of collected points may be many more but to manage the data better it is typically sufficient to keep results for every 5 degrees and drop all other results.

Some advantages of embodiments described herein may be summarized as follows. The test time impact of settling times via start/stop motion profiles is removed. Deterministic, repeatable and quantifiable delays are introduced between the motion and the measurement of the beam power. Repeatability of measurements across samples sets of AUTs is improved due to the deterministic relationship between AUT position and measurement. The variance of the distribution of results is reduced due to a reduction in uncertainty of the position/measurement relationship. Additionally, measurement uncertainty of the beam power measurement is removed due to the adjustable deterministic delay between movement through a set spatial location and the measurement of the beam power at that location.

Calibration with Motion/Data Time Alignment Servomechanism

When adding motion to the measurement set of an AUT/DUT, a potential new source of measurement uncertainty may be introduced relating to the position and motion of the AUT that did not previously exist in non-motive test scenarios. This measurement uncertainty contribution to the overall uncertainty of the reported result may be characterized in isolation by testing the sensitivity of the measurement result (e.g., RF power) to the absolute location of the RF beam center relative to the center of the measurement antenna. Methods in the art for characterizing this contribution are known in measurement uncertainty models for OTA testing. However, identifying these sources of error, may not be valuable when the measurement at a given position is not repeatable over time or over a single motion profile because the timing alignment between the acquisition of the RF data and the position of AUT are non-deterministic.

When utilizing the deterministic pulse triggered measurement method described above, the measured data may be reliably repeated over multiple AUTs and over different positions along a single AUT profile, as long as no changes are made to the test setup that would affect timing delays between the motion and measurement components of the system.

Some embodiments may implement closed-loop processes on sampled data flowing through embedded RT processing nodes (e.g., field programmable gate arrays (FPGAs), or other types of processing nodes), that allow in-the-loop adjustment on the data. After setting up the motion/measurement system that relies on triggered pulse trains, there are timing delays in the system that may have unknown impacts on the measurement result and the resulting uncertainty computed. To avoid this, a servomechanism may be implemented as part of a "fast calibration routine" that may operate according to the following method steps:

1. Set a fixed beam state/location.
2. Move the positioner back and forth in azimuth and elevation through the position that is expected to be delivering the beam center to the test antenna center.
3. Each time the positioner passes through the set location, it may produce a pulse sent to the measurement system to trigger acquisition.
4. An FPGA implemented computation loop may actively find the ideal alignment between the trigger position and the computed maximum measured power level after that trigger. This alignment time may be used to determine how many pre-trigger samples should be used for the triggered acquisition, and how many total samples may be used to compute the measurement for each AUT location.

The following numbered paragraphs describe additional embodiments:

In some embodiments, an antenna characterization system (ACS) comprises a chamber, which may be an anechoic chamber; a counter apparatus; a radio frequency (RF) signal analyzer coupled to one or more receive antennas and the counter apparatus, wherein the one or more receive antennas are positioned inside the chamber, wherein the RF signal analyzer is configured to acquire RF measurements made by the one or more receive antennas of transmissions of an antenna under test (AUT); an adjustable positioner coupled to the counter apparatus; and a computer comprising a processor and coupled to each of the adjustable positioner, the counter apparatus, and the RF signal analyzer.

The computer may be configured to initialize a measurement process on the AUT by causing the adjustable positioner to continually transition the AUT inside the chamber through a plurality of orientations without halting the motion of the adjustable positioner between orientations, wherein the adjustable positioner is configured to automatically transmit a signal through one or more channels to the counter apparatus in response to the adjustable positioner positioning the AUT according to each of the plurality of orientations.

In response to receiving the signals from the adjustable positioner through the one or more channels, the counter apparatus may be configured to modify a first counter value, transmit the modified first counter value to the computer, and transmit a first acquisition trigger to the RF signal analyzer, wherein said modifying the first counter value, transmitting the modified first counter value, and transmitting the first acquisition trigger occur a plurality of times at different respective orientations of the AUT.

The RF signal analyzer may be configured to acquire an RF measurement of transmissions of the AUT and relay the result of the RF measurement to the computer in response to receiving each of the plurality of first acquisition triggers.

The computer may be further configured to correlate the modified first counter values received from the counter apparatus with the results of the RF measurements to determine an orientation of the plurality of orientations of the AUT corresponding to each of the results of the RF measurements, output a correlated list of results of the RF measurements and their respective orientations of the AUT.

The adjustable positioner may provide direct hardware signaling to the counter apparatus, and wherein the counter apparatus provides the first acquisition triggers to the RF signal analyzer through direct hardware signaling.

Said continually transitioning the AUT through the plurality of orientations may be performed at a speed such that the time between successive signal transmissions through each of the one or more channels is greater than an acquisition time of each of the RF measurements.

Said modifying the first counter value may comprise incrementing or decrementing the first counter value, and the counter apparatus may comprise an edge detector configured to detect the front edge in time of an incremented first counter value and the back edge in time of a decremented first counter value. In these embodiments, said transmitting the modified first counter value to the computer and said transmitting the first acquisition trigger to the RF signal analyzer may be performed by the edge detector in response to detecting the front edge of the incremented first counter value or the back edge of the decremented first counter value.

In some embodiments, the counter apparatus comprises a frequency divisor, and said transmitting the modified first counter value to the computer and said transmitting the first acquisition trigger to the RF signal analyzer is performed by the frequency divisor for every Nth modified first counter value and every Nth first acquisition trigger, where N is a positive integer.

in response to receiving the signals from the adjustable positioner through the one or more channels, the counter apparatus may be further configured to modify a second counter value, transmit the modified second counter value to the computer, and transmit a second acquisition trigger to the RF signal analyzer, wherein said modifying the second counter value, transmitting the modified second counter value, and transmitting the second acquisition trigger occur a plurality of times at different respective orientations of the AUT, and wherein the second counter value is associated with a different axis of rotation of the adjustable positioner than the first counter value. In these embodiments, the counter apparatus may comprise a frequency divisor, wherein said transmitting the modified first and second counter values to the computer and said transmitting the first and second acquisition triggers to the RF signal analyzer is performed by the frequency divisor for every Nth modified first or second counter value and every Nth first or second acquisition trigger, where N is a positive integer.

In some embodiments, said acquiring an RF measurement by the RF signal analyzer is not initiated when one of the plurality of first acquisition triggers is received during a previously initiated and ongoing RF measurement acquisition. The RF signal analyzer may be further configured to transmit a reference trigger to the counter apparatus in response to initiating each RF measurement acquisition, and said transmitting the modified first counter value to the computer by the counter apparatus may be performed further in response to the counter apparatus receiving the reference trigger from the RF signal analyzer. The RF signal analyzer may be configured to refrain from transmitting the reference trigger to the counter apparatus when reception of a respective first acquisition triggers does not result in initiation of acquisition of the RF measurement.

Some embodiments describe a method for measuring transmissions of a device under test (DUT), the method comprising: by a computer, initializing a measurement process on the DUT by causing an adjustable positioner to continually transition the DUT inside a chamber through a plurality of orientations without halting the motion of the adjustable positioner between orientations; automatically transmitting, by the adjustable positioner, a signal through one or more channels to the computer in response to the adjustable positioner positioning the DUT according to each of the plurality of orientations; in response to receiving the signals from the adjustable positioner through the one or more channels, automatically transmitting, by the computer, a sequence of acquisition triggers to a radio frequency (RF) signal analyzer.

The method may further comprise, by the RF signal analyzer: automatically acquiring an RF measurement of transmissions of the DUT from one or more receive antennas positioned inside the chamber in response to receiving each of the acquisition triggers in the sequence of acquisition triggers; and transmitting the results of the RF measurements to the computer.

The method may further comprise, by the computer: correlating the signals received from the adjustable positioner with the results of the RF measurements received from the RF signal analyzer to determine an orientation of the plurality of orientations of the DUT corresponding to each of the results of the RF measurements; and outputting a correlated list of results of the RF measurements and their respective orientations of the DUT.

In some embodiments, the one or more channels comprise a first channel and a second channel of a quadrature encoder scheme, and the method further comprises: by the computer, determining a direction of motion of the DUT based on a relative phase between respective signals of the first channel and the second channel, wherein said correlating the signals received from the adjustable positioner with the results of the RF measurements received from the RF signal analyzer is performed based on the determined direction of motion.

In some embodiments, said continually transitioning the DUT through the plurality of orientations is performed at a speed such that the time between successive signal transmissions through each of the one or more channels is greater than an acquisition time of each of the RF measurements.

In some embodiments, the signals received from the adjustable positioner comprise a first set of signals corresponding to motion of the adjustable positioner around a first axis of rotation, and a second set of signals corresponding to motion of the adjustable positioner around a second axis of rotation orthogonal to the first axis of rotation.

In some embodiments, said automatically acquiring the RF measurement by the RF signal analyzer is not performed when an acquisition trigger of the sequence of acquisition triggers is received during a previously initiated and ongoing RF measurement acquisition, and the RF signal analyzer is further configured to transmit a reference trigger to the computer in response to performing each RF measurement acquisition. The RF signal analyzer may be configured to refrain from transmitting the reference trigger to the computer when reception of the respective first acquisition trigger does not result in the RF measurement acquisition.

Said correlating the signals received from the adjustable positioner with the results of the RF measurements received from the RF signal analyzer to determine an orientation of the plurality of orientations of the DUT corresponding to each of the results of the RF measurements may be performed based at least in part on the reference triggers received from the RF signal analyzer.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A system for correlating radio frequency (RF) measurements of a device-under-test (DUT) with orientations of the DUT, the system comprising:
   a computer coupled to a non-transitory memory medium; and
   a RF measurement system coupled to the computer,
   wherein the computer is configured to transmit a sequence of acquisition triggers to the RF measurement system,
   wherein, in response to receiving a first acquisition trigger of the sequence of acquisition triggers when the RF measurement system is not currently acquiring an RF measurement, the RF measurement system is configured to transmit a reference trigger to the computer, initiate the RF measurement of the DUT, and transmit a first result of the RF measurement to the computer, wherein, in response to receiving a second acquisition trigger of the sequence of acquisition triggers when the RF measurement system is currently acquiring the RF measurement, the RF measurement system is configured to not transmit the reference trigger to the computer and not initiate the RF measurement of the DUT, wherein the computer is further configured to:
receive the reference trigger and the first result from the RF measurement system; and
generate antenna characterization information of the DUT based on a correlation of the first result with a determined orientation of the DUT, wherein the orientation of the DUT is determined based at least in part on a value of one or more counters stored on the computer at the time when the reference trigger is received from the RF measurement system.

2. The system of claim 1,
wherein the one or more counters comprise a first counter corresponding to a first axis of rotation of the DUT and a second counter corresponding to a second axis of rotation of the DUT, and
wherein a value of the first counter at the time when the reference trigger is received is used to determine an angle of orientation of the DUT about the first axis and a value of the second counter at the time when the reference trigger is received is used to determine an angle of orientation of the DUT about the second axis.

3. The system of claim 2,
wherein the value of the first counter is modified in response to the DUT rotating about the first axis,
wherein the value of the second counter is modified in response to the DUT rotating about the second axis,
wherein the computer is further configured to:
count a number of times either of the first and second counters are modified; and
transmit an acquisition trigger of the sequence of acquisition triggers to the RF measurement system ever $N^{th}$ time either of the first and second counters are modified, wherein N is a positive integer.

4. The system of claim 1,
wherein the values of the one or more counters are modified in response to signals received from an adjustable positioner that orients the DUT, wherein the signals corresponding to each of the one or more counters are received on one or more channels.

5. The system of claim 4,
wherein the one or more channels comprise a first channel and a second channel of a quadrature encoder scheme,
wherein said modifying the values of the one or more counters comprises incrementing or decrementing the values of the one or more counters, and
wherein a relative phase between respective signals of the first channel and the second channel determines whether the counter apparatus increments or decrements the values of the one or more counters.

6. The system of claim 4,
wherein said modifying the values of the one or more counters comprises incrementing or decrementing the values of the one or more counters,
wherein the computer comprises an edge detector configured to detect the front edge in time of an incremented value of the one or more counters and the back edge in time of a decremented value of the one or more counters, and wherein said transmitting by the computer of each acquisition trigger in the sequence of acquisition triggers to the RF measurement system is performed in response to the edge detector detecting the front edge of the incremented value of the one or more counters or the back edge of the decremented value of the one or more counters.

7. The ACS of claim 1,
wherein said acquiring a plurality of measurements of the DUT comprises measuring directional transmission properties of one or more antennas of the DUT at different orientations of the DUT.

8. The ACS of claim 1,
wherein said acquiring a plurality of measurements of the DUT comprises transmitting RF signals to the DUT within the chamber, and measuring directional reception properties of the RF signals by the DUT at different orientations of the DUT.

9. The ACS of claim 1,
wherein the antenna characterization information is usable to design antenna characteristics of the DUT.

10. A method for correlating radio frequency (RF) measurements of a device-under-test (DUT) with orientations of the DUT, the method comprising:
by a computer:
transmitting a sequence of acquisition triggers to an RF measurement system;
by the RF measurement system:
in response to receiving a first acquisition trigger of the sequence of acquisition triggers when the RF measurement system is not currently acquiring an RF measurement:
transmitting a reference trigger to the computer;
initiating the RF measurement of the DUT; and
transmitting a first result of the RF measurement to the computer;
in response to receiving a second acquisition trigger of the sequence of acquisition triggers when the RF measurement system is currently acquiring the RF measurement:
refrain from transmitting the reference trigger to the computer; and
refrain from initiating the RF measurement of the DUT; and
by the computer:
receiving the reference trigger and the first result from the RF measurement system; and
generating antenna characterization information of the DUT based on a correlation of the first result with a determined orientation of the DUT, wherein the orientation of the DUT is determined based at least in part on a value of one or more counters stored on the computer at the time when the reference trigger is received from the RF measurement system.

11. The method of claim 10,
wherein the one or more counters comprise a first counter corresponding to a first axis of rotation of the DUT and a second counter corresponding to a second axis of rotation of the DUT, and
wherein the method further comprises:
by the computer:
using a value of the first counter at the time when the reference trigger is received to determine an angle of orientation of the DUT about the first axis; and using a value of the second counter at the time when the reference trigger is received to determine an angle of orientation of the DUT about the second axis.

12. The method of claim 11,
wherein the value of the first counter is modified in response to the DUT rotating about the first axis,
wherein the value of the second counter is modified in response to the DUT rotating about the second axis,
wherein the method further comprises:
by the computer:
counting a number of times either of the first and second counters are modified; and
transmitting an acquisition trigger of the sequence of acquisition triggers to the RF measurement system ever $N^{th}$ time either of the first and second counters are modified, wherein N is a positive integer.

13. The method of claim 10, the method further comprising:
by the computer:
modifying the values of the one or more counters in response to signals received from an adjustable positioner that orients the DUT, wherein the signals corresponding to each of the one or more counters are received on one or more channels.

14. The method of claim 13,
wherein the one or more channels comprise a first channel and a second channel of a quadrature encoder scheme,
wherein said modifying the values of the one or more counters comprises incrementing or decrementing the values of the one or more counters, and
wherein a relative phase between respective signals of the first channel and the second channel determines whether the counter apparatus increments or decrements the values of the one or more counters.

15. The method of claim 13,
wherein said modifying the values of the one or more counters comprises incrementing or decrementing the values of the one or more counters, the method further comprising:
by the computer:
detecting the front edge in time of an incremented value of the one or more counters and the back edge in time of a decremented value of the one or more counters, and
wherein said transmitting by the computer of each acquisition trigger in the sequence of acquisition triggers to the RF measurement system is performed in response to the edge detector detecting the front edge of the incremented value of the one or more counters or the back edge of the decremented value of the one or more counters.

16. The method of claim 10,
wherein said acquiring a plurality of measurements of the DUT comprises measuring directional transmission properties of one or more antennas of the DUT at different orientations of the DUT.

17. The method of claim 10,
wherein said acquiring a plurality of measurements of the DUT comprises transmitting RF signals to the DUT within the chamber, and measuring directional reception properties of the RF signals by the DUT at different orientations of the DUT.

18. The method of claim 10, the method further comprising:
using the antenna characterization information to design antenna characteristics of the DUT.

19. An antenna characterization system (ACS), comprising:
a chamber;
a counter apparatus;
a radio frequency (RF) signal analyzer coupled to one or more receive antennas and the counter apparatus, wherein the one or more receive antennas are positioned inside the chamber, wherein the RF signal analyzer is configured to acquire RF measurements made by the one or more receive antennas of transmissions of an antenna under test (AUT); and
an adjustable positioner coupled to the counter apparatus; and
a computer comprising a processor and coupled to each of the adjustable positioner, the counter apparatus, and the RF signal analyzer, wherein the computer is configured to:
initialize a measurement process on the AUT by causing the adjustable positioner to continually transition the AUT inside the chamber through a plurality of orientations without halting the motion of the adjustable positioner between orientations, wherein the adjustable positioner is configured to automatically transmit a signal through one or more channels to the counter apparatus in response to the adjustable positioner positioning the AUT according to each of the plurality of orientations,
wherein, in response to receiving the signals from the adjustable positioner through the one or more channels, the counter apparatus is configured to:
modify a first counter value;
transmit the modified first counter value to the computer; and
transmit a first acquisition trigger to the RF signal analyzer, wherein said modifying the first counter value, transmitting the modified first counter value, and transmitting the first acquisition trigger occur a plurality of times at different respective orientations of the AUT, and
wherein the RF signal analyzer is configured to acquire an RF measurement of transmissions of the AUT and relay the result of the RF measurement to the computer in response to receiving each of the plurality of first acquisition triggers, and
wherein the computer is further configured to:
correlate the modified first counter values received from the counter apparatus with the results of the RF measurements to determine an orientation of the plurality of orientations of the AUT corresponding to each of the results of the RF measurements; and
output a correlated list of results of the RF measurements and their respective orientations of the AUT.

20. The ACS of claim 19,
wherein, in response to receiving the signals from the adjustable positioner through the one or more channels, the counter apparatus is further configured to:
modify a second counter value;
transmit the modified second counter value to the computer; and
transmit a second acquisition trigger to the RF signal analyzer, wherein said modifying the second counter value, transmitting the modified second counter value, and transmitting the second acquisition trigger occur a plurality of times at different respective orientations of the AUT, and wherein the second counter value is associated with a different axis of rotation of the adjustable positioner than the first counter value.

\* \* \* \* \*